(12) United States Patent
Kim

(10) Patent No.: US 9,798,614 B2
(45) Date of Patent: Oct. 24, 2017

(54) CONTROLLER, SEMICONDUCTOR MEMORY SYSTEM AND OPERATING METHOD THEREOF

(71) Applicant: SK hynix Inc., Gyeonggi-do (KR)

(72) Inventor: Do-Hun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 18 days.

(21) Appl. No.: 14/960,009

(22) Filed: Dec. 4, 2015

(65) Prior Publication Data
US 2016/0378596 A1 Dec. 29, 2016

(30) Foreign Application Priority Data

Jun. 23, 2015 (KR) ........................ 10-2015-0088862

(51) Int. Cl.
| | |
|---|---|
| H03M 13/29 | (2006.01) |
| G06F 11/10 | (2006.01) |
| G11C 29/52 | (2006.01) |
| H03M 13/45 | (2006.01) |
| H03M 13/37 | (2006.01) |
| H03M 13/15 | (2006.01) |
| G11C 29/02 | (2006.01) |
| G11C 29/42 | (2006.01) |
| G11C 29/04 | (2006.01) |
| H03M 13/11 | (2006.01) |
| H03M 13/23 | (2006.01) |
| H03M 13/25 | (2006.01) |

(52) U.S. Cl.
CPC .......... *G06F 11/1068* (2013.01); *G11C 29/52* (2013.01); *H03M 13/293* (2013.01); *H03M 13/2909* (2013.01); *H03M 13/3707* (2013.01); *H03M 13/45* (2013.01); *G11C 29/02* (2013.01); *G11C 29/42* (2013.01); *G11C 2029/0411* (2013.01); *H03M 13/1102* (2013.01); *H03M 13/152* (2013.01); *H03M 13/1515* (2013.01); *H03M 13/1545* (2013.01); *H03M 13/23* (2013.01); *H03M 13/251* (2013.01); *H03M 13/256* (2013.01); *H03M 13/2957* (2013.01)

(58) Field of Classification Search
CPC ....................................................... H03M 13/15
USPC ......................... 714/755, 764, 766, 773, 781
See application file for complete search history.

(56) References Cited

U.S. PATENT DOCUMENTS

| | | | | |
|---|---|---|---|---|
| 8,351,290 B1 * | 1/2013 | Huang | ............... | G11C 16/349 365/218 |
| 8,875,002 B1 * | 10/2014 | Dutta | ............... | H03M 13/1148 714/781 |
| 9,128,868 B2 * | 9/2015 | Lastras-Montano | | G06F 11/1044 |
| 2014/0351672 A1 * | 11/2014 | Marrow | .............. | H03M 13/152 714/764 |

(Continued)

FOREIGN PATENT DOCUMENTS

| | | |
|---|---|---|
| KR | 101267958 | 5/2013 |
| KR | 1020130043962 | 5/2013 |

*Primary Examiner* — Fritz Alphonse
(74) *Attorney, Agent, or Firm* — IP & T Group LLP

(57) ABSTRACT

An operating method of a controller includes generating error reliability of data based on reliability information of one or more error-corrected bits of the data, wherein the data is read out from a semiconductor memory device and a hard decision ECC decoding to the data through a BCH code is determined as successful; and determining miscorrection of the data based on the error reliability.

20 Claims, 20 Drawing Sheets

(56) References Cited

U.S. PATENT DOCUMENTS

2015/0046771 A1* 2/2015 Kim .................. H03M 13/1128
714/764
2015/0277792 A1* 10/2015 Ma ........................ G06F 3/0619
711/103
2015/0309875 A1* 10/2015 Mittelholzer ....... G06F 11/1012
714/766

* cited by examiner

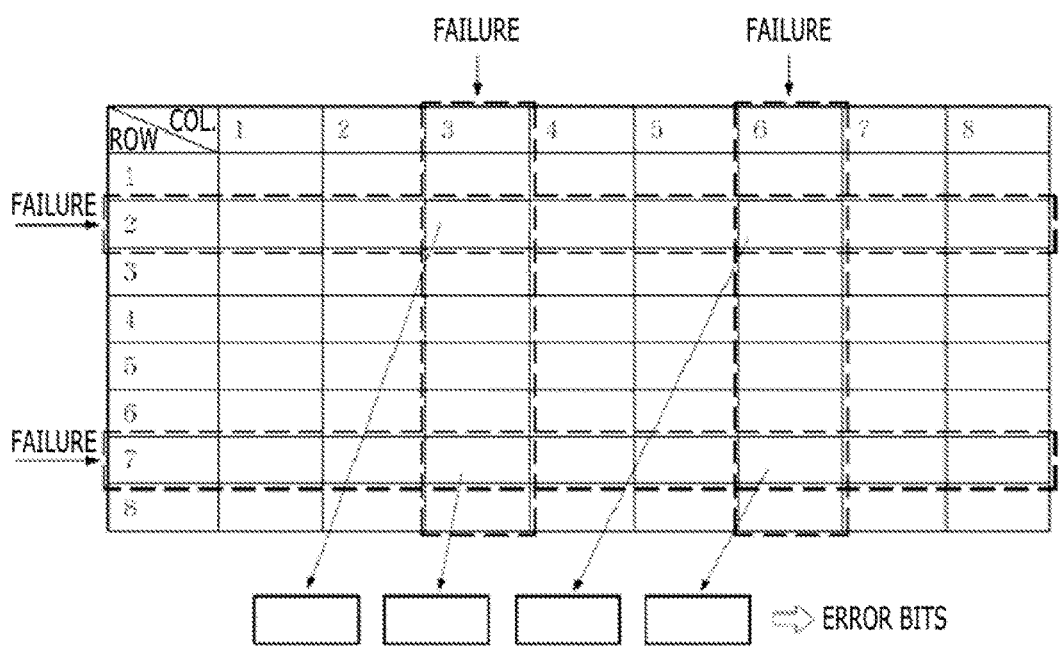

CONTROLLER, SEMICONDUCTOR MEMORY SYSTEM AND OPERATING METHOD THEREOF

CROSS-REFERENCE TO RELATED APPLICATIONS

The present application claims priority of Korean Patent Application No. 10-2015-0088862, filed on Jun. 23, 2015, which is incorporated herein by reference in its entirety.

BACKGROUND

1. Field

Various exemplary embodiments of the present invention relate to semiconductor design technology and, more particularly, to a controller, a semiconductor memory system, a data storage system and an operating method thereof.

2. Description of the Related Art

In general, semiconductor memory devices are classified into volatile memory devices, representatively such as Dynamic Random Access Memory (DRAM) and Static RAM (SRAM), and non-volatile memory devices, representatively such as Read Only Memory (ROM), Mask ROM (MROM), Programmable ROM (PROM), Erasable PROM (EPROM), Electrically EPROM (EEPROM), Ferromagnetic RAM (FRAM), Phase change RAM (PRAM), Magnetic RAM (MRAM), Resistive RAM (RRAM) and flash memory.

The volatile memory device loses data stored therein when power supply thereto is interrupted, whereas a non-volatile memory device retains data stored therein even when power supply thereto is interrupted. The flash memory device as the non-volatile memory device is widely used as a storage medium in a computer system because of its high program speed, low power consumption and large data storage capacity.

In the non-volatile memory device, especially in the flash memory device, states of data of each memory cell depend on the number of bits that the memory cell can program. A memory cell storing 1-bit data per cell is called a single-bit cell or a single-level cell (SLC). A memory cell storing multi-bit data (i.e., 2 or more bits data) per cell is called a multi-bit cell, a multi-level cell (MLC) or a multi-state cell. The MLC is advantageous for high integration. However, as the number of bits programmed in each memory cell increase, the reliability decreases and the read failure rate increases.

For example, when k bits are to be programmed in a memory cell, one of $2^k$ threshold voltages is formed in the memory cell. Due to the minute differences between the electrical characteristics of memory cells, the threshold voltages of memory cells programmed for the same data form threshold voltage distribution. The threshold voltage distributions correspond to $2^k$ data values representing k-bit information, respectively.

However, a voltage window available for the threshold voltage distributions is finite. Therefore, as the value k increases, the distance between the threshold voltage distributions decreases and the neighboring threshold voltage distributions overlap each other. As the neighboring threshold voltage distributions overlap each other, read data may include several or several tens of error bits.

FIG. 1 is a threshold voltage distribution schematically illustrating program and erase states of a 3-bit multi-level cell (3-bit MLC) non-volatile memory device.

FIG. 2 is a threshold voltage distribution schematically illustrating program and erase states due to characteristic deterioration of the 3-bit MLC non-volatile memory device.

In the MLC non-volatile memory device, such as the MLC flash memory device capable of storing k-bit data in a single memory cell, the memory cell may have one of $2^k$ threshold voltage distributions. For example, the 3-bit MLC has one of 8 threshold voltage distributions.

The threshold voltages of memory cells programmed for the same data form the threshold voltage distribution due to characteristic differences between memory cells. In the 3-bit MLC non-volatile memory device, as illustrated in FIG. 1, the threshold voltage distributions are formed in correspondence with the data states including 7 program states 'P1' to 'P7' and an erase state 'E'.

FIG. 1 shows an ideal case in which the threshold voltage distributions do not overlap and have read voltage margins therebetween. Referring to the flash memory example of FIG. 2, the memory cell may experience charge loss that electrons trapped at a floating gate or tunnel oxide film are discharged over time. Such charge loss may accelerate when the tunnel oxide film deteriorates by iterative program and erase operations. The charge loss results in a decrease in the threshold voltages of memory cells. For example, as illustrated in FIG. 2, the threshold voltage distribution may be shifted left due to charge loss.

Further, program disturbance, erase disturbance and/or back pattern dependency also cause increases in threshold voltages. As characteristics of memory cells deteriorate, neighbouring threshold voltage distributions may overlap, as illustrated in FIG. 2.

Once neighbouring threshold voltage distributions overlap, read data may include a significant number of errors when a particular read voltage is applied to a selected word line. For example, when a sensed state of a memory cell according to a read voltage Vread3 applied to a selected word line is on, the memory cell is determined to have a second program state 'P2'. When a sensed state of a memory cell according to a read voltage Vread3 applied to a selected word line is off, the memory cell is determined to have a third program state 'P3'. However, when neighbouring threshold voltage distributions overlap, the memory cell actually having the third program state 'P3' may be erroneously determined to have the second program state 'P2'. In short, when the neighbouring threshold voltage distributions overlap as illustrated in FIG. 2, read data may include a significant number of errors.

What is therefore required is a scheme for precisely reading data stored in memory cells of a semiconductor memory device.

SUMMARY

Various embodiments of the present invention are directed to a controller, a semiconductor memory system, and an operating method thereof capable of correctly reading data stored in a memory cell.

In accordance with an embodiment of the present invention, an operating method of a controller may include generating error reliability of data based on reliability information of one or more error-corrected bits of the data, wherein the data is read out from a semiconductor memory device and a hard decision ECC decoding to the data through a Bose-Chaudhuri-Hocquenghem (BCH) code is determined as successful; and determining miscorrection of the data based on the error reliability.

The error reliability may be represented by a following equation:

$$REL_{ER}=abs(SV_1)+abs(SV_2)+\ldots+abs(SV_N), \quad \text{[Equation]}$$

wherein "$REL_{ER}$" represents the error reliability, and "$SV_n$" ($1\leq n\leq N$) represents the reliability information of the error-corrected bits of the data.

The reliability information may be a log likelihood ratio (LLR).

The determining of the miscorrection may determine the data as miscorrected when the error reliability of the data is greater than a predetermined reliability threshold.

The predetermined reliability threshold may be represented by a following equation:

$$REL_{TH1}=N*P, \quad \text{[Equation]}$$

wherein "$REL_{TH1}$" is the predetermined reliability threshold, and "N" is a number of the error-corrected bits, and "P" is a parameter.

The P may be 0.5.

In accordance with an embodiment of the present invention, an operating method of a controller may include a first step of generating, when a hard decision ECC decoding to data fails, the data being read out from a semiconductor memory device according to a first hard decision read voltage, error reliability of the data being based on reliability information of one or more error-corrected bits of the data, wherein the reliability information is obtained according to first soft decision read voltages determined on the basis of the first hard read voltage; and a second step of determining whether to perform a soft decision ECC decoding to the data according to the first soft decision read voltages, based on the error reliability.

The error reliability may be represented by a following equation:

$$REL_{ER}=abs(SV_1)+abs(SV_2)+\ldots+abs(SV_N), \quad \text{[Equation]}$$

wherein "$REL_{ER}$" represents the error reliability, and "$SV_n$" ($1\leq n\leq N$) represents the reliability information of the error-corrected bits of the data.

The reliability information may be a log likelihood ratio (LLR).

The second step may determine whether to perform the soft decision ECC decoding to the data according to the first soft decision read voltages by comparing the error reliability with a predetermined reliability threshold. The operation method may further include a third step of performing the soft decision ECC decoding to the data according to second soft decision read voltages when the error reliability is smaller than the predetermined reliability threshold. The operation method may further include a third step of performing the hard decision ECC decoding to the data according to a second hard decision read voltage when the error reliability is smaller than the predetermined reliability threshold.

The hard decision decoding may be performed through a turbo product code (TPC).

The soft decision decoding may be performed through a turbo product code (TPC).

In accordance with an embodiment of the present invention, a controller may include a hard decision ECC decoding means suitable for reading out data from a semiconductor memory device and performing a hard decision ECC decoding to the data through a Bose-Chaudhuri-Hocquenghem (BCH) code; and a miscorrection determination means suitable for determining miscorrection of the data, to which the hard decision ECC decoding is determined as successful, by using error reliability of data, which is generated on the basis of reliability information of one or more error-corrected bits of the data.

The error reliability may be represented by a following equation:

$$REL_{ER}=abs(SV_1)+abs(SV_2)+\ldots+abs(SV_N), \quad \text{[Equation]}$$

wherein "$REL_{ER}$" represents the error reliability, and "$SV_n$" ($1\leq n\leq N$) represents the reliability information of the error-corrected bits of the data.

The reliability information may be a log likelihood ratio (LLR).

The miscorrection determination means may determine the data as miscorrected when the error reliability of the data is greater than a predetermined reliability threshold.

The predetermined reliability threshold may be represented by a following equation:

$$REL_{TH1}=N*P, \quad \text{[Equation]}$$

wherein "$REL_{TH1}$" is the predetermined reliability threshold, and "N" is a number of the error-corrected bits, and "P" is a parameter.

The P may be 0.5.

In accordance with an embodiment of the present invention, a controller may include a first means suitable for performing a hard decision ECC decoding to data read out from a semiconductor memory device according to a hard decision read voltage; a second means suitable for performing a soft decision ECC decoding to the data according soft decision read voltages when the hard decision ECC decoding to data fails; a third means suitable for generating, when the hard decision ECC decoding to data fails according to a first hard decision read voltage, error reliability of the data based on reliability information of one or more error-corrected bits of the data, wherein the reliability information is obtained according to first soft decision read voltages determined on the basis of the first hard read voltage; and a fourth means suitable for determining whether to perform the soft decision ECC decoding to the data according to the first soft decision read voltages, based on the error reliability.

The error reliability may be represented by a following equation:

$$REL_{ER}=abs(SV_1)+abs(SV_2)+\ldots+abs(SV_N), \quad \text{[Equation]}$$

wherein "$REL_{ER}$" represents the error reliability, and "$SV_n$" ($1\leq n\leq N$) represents the reliability information of the error-corrected bits of the data.

The reliability information may be a log likelihood ratio (LLR).

The fourth means may determine whether to perform the soft decision ECC decoding to the data according to the first soft decision read voltages by comparing the error reliability with a predetermined reliability threshold. The second means may further perform the soft decision ECC decoding to the data according to second soft decision read voltages when the error reliability is smaller than the predetermined reliability threshold. The first means may further perform the hard decision ECC decoding to the data according to a second hard decision read voltage when the error reliability is smaller than the predetermined reliability threshold.

The hard decision decoding may be performed through a turbo product code (TPC).

The soft decision decoding may be performed through a turbo product code (TPC).

In accordance with various embodiments of the present invention, data stored in a memory cell may be precisely read.

BRIEF DESCRIPTION OF THE DRAWINGS

FIG. 6 is an example diagram illustrating a TPC code message.

DETAILED DESCRIPTION

Figure 1:
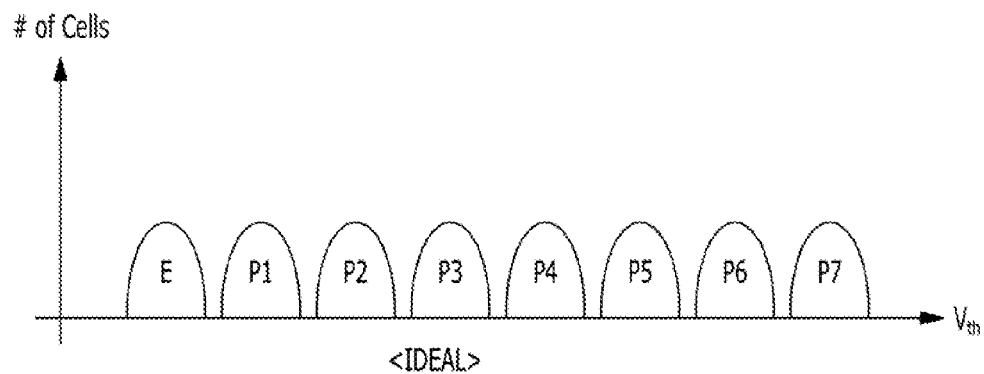
FIG. 1 is a threshold voltage distribution schematically illustrating program and erase states of a 3-bit multi-level cell (3-bit MLC) non-volatile memory device.
Figure 2:
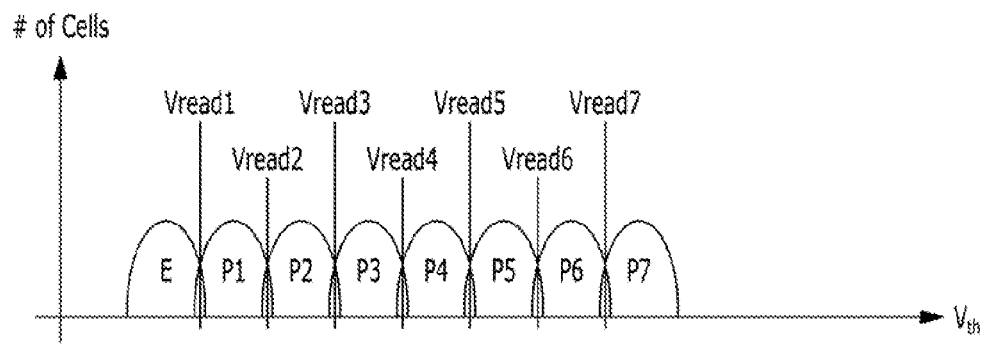
FIG. 2 is a threshold voltage distribution schematically illustrating program and erase states due to characteristic deterioration of a 3-bit MLC non-volatile memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. The drawings are not necessarily to scale and in some instances, proportions may have been exaggerated in order to clearly illustrate features of the embodiments. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence. It should be readily understood that the meaning of "on" and "over" In the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to a case where the first layer is formed directly on the second layer or the substrate but also a case where a third layer exists between the first layer and the second layer or the substrate.

Figure 3:
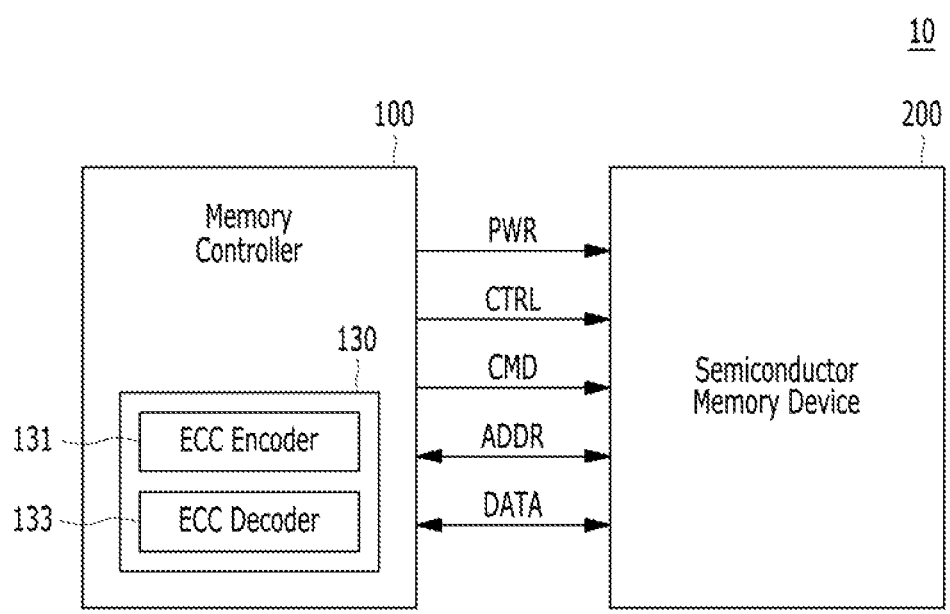
FIG. 3 is a block diagram schematically illustrating a semiconductor memory system in accordance with an embodiment of the present invention.

FIG. 3 is a block diagram schematically illustrating a semiconductor memory system 10 in accordance with an embodiment of the present invention.

Figure 4A:
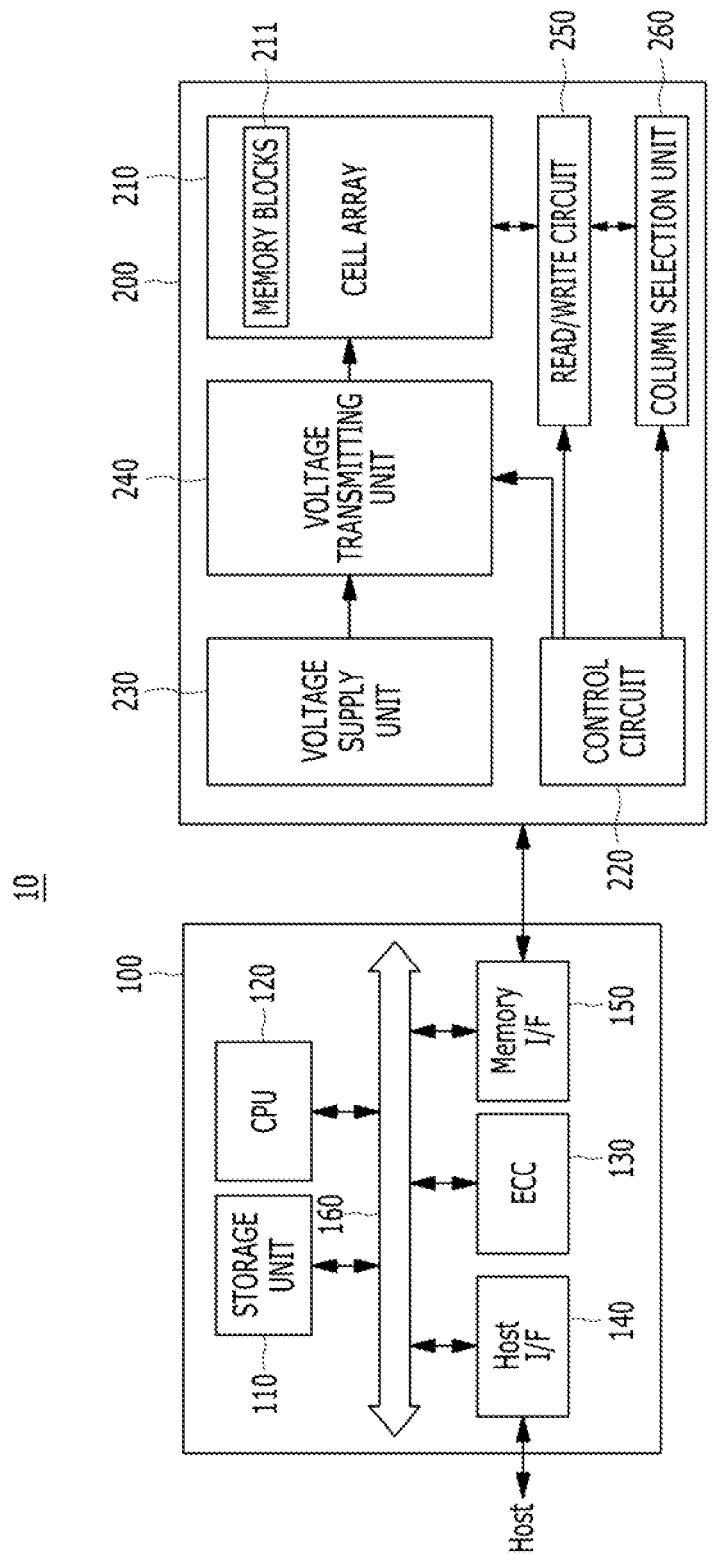
FIG. 4A is a block diagram illustrating a semiconductor memory system shown in FIG. 3.

FIG. 4A is a block diagram illustrating the semiconductor memory system 10 shown in FIG. 3.

Figure 4B:
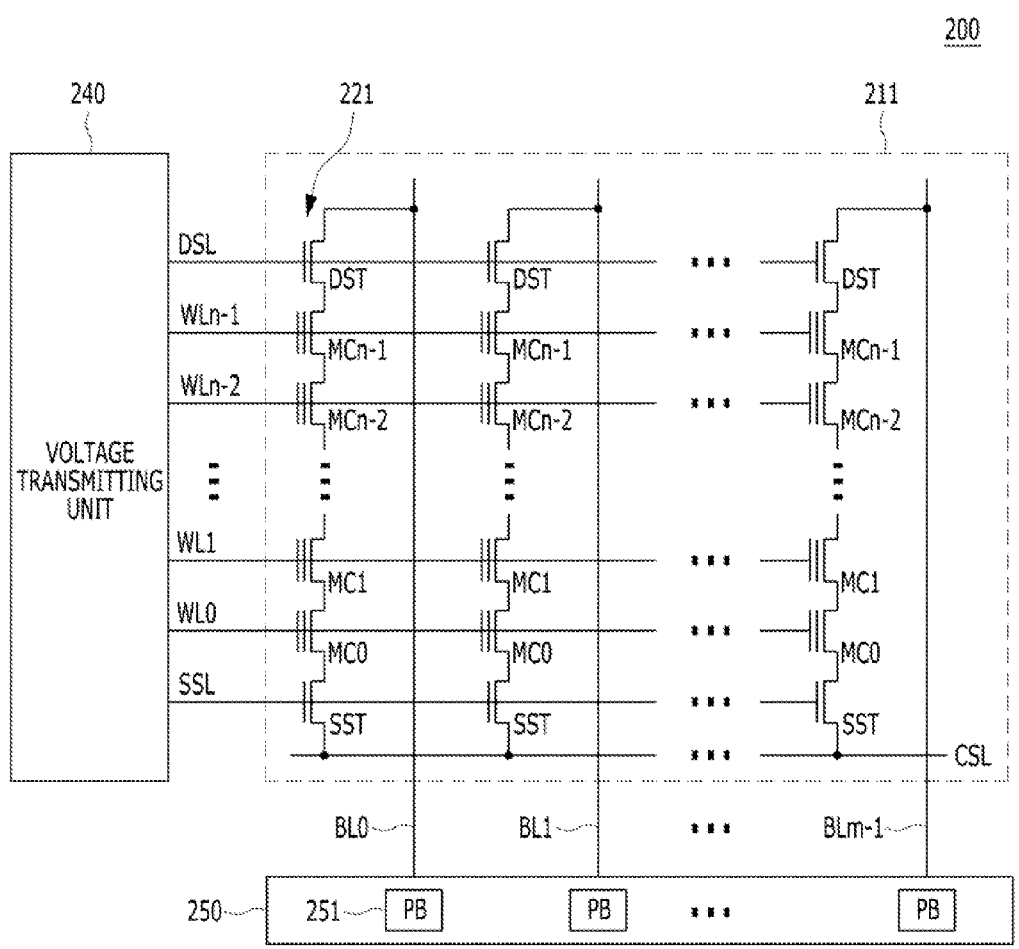
FIG. 4B is a circuit diagram illustrating a memory block shown in FIG. 4A.

FIG. 4B is a circuit diagram illustrating a memory block 211 shown in FIG. 4A.

Figure 4C:
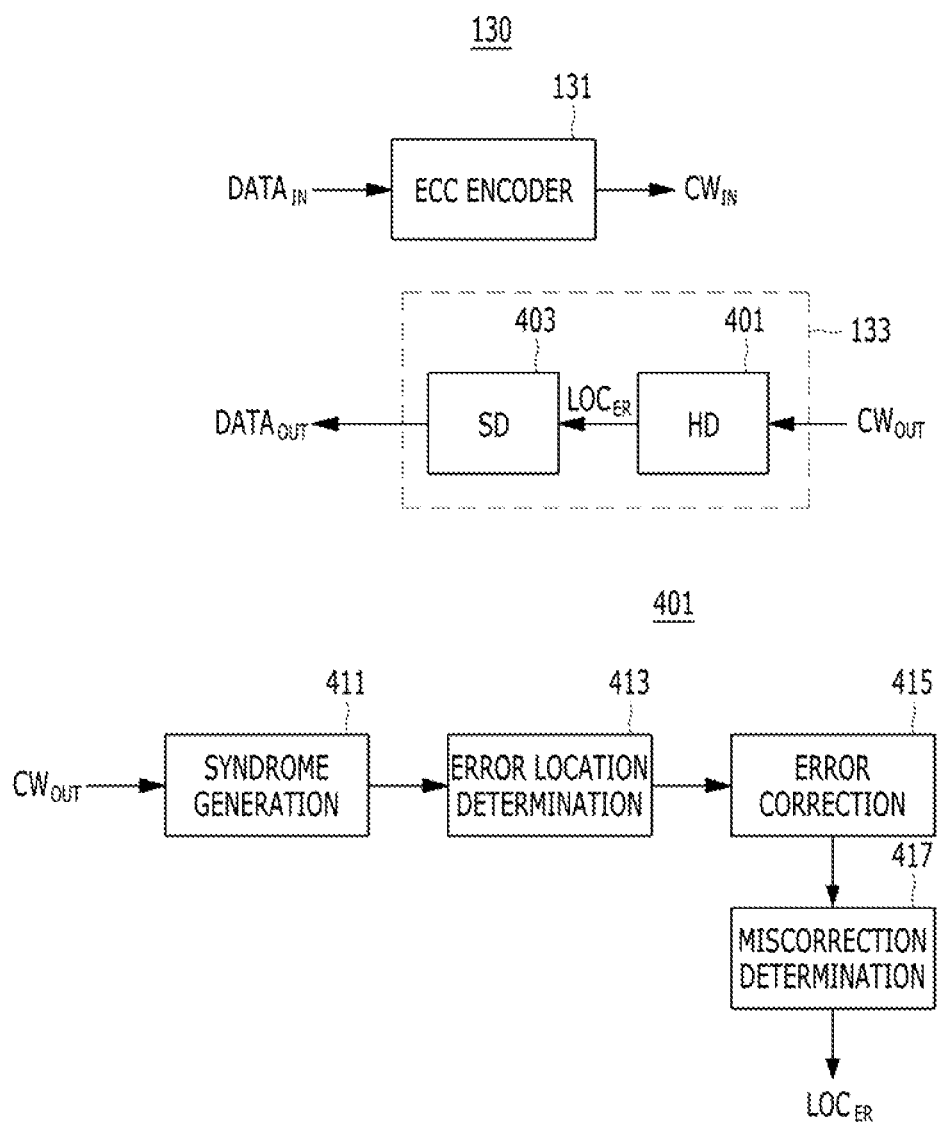
FIG. 4C is a block diagram illustrating an ECC unit shown in FIG. 4A.

FIG. 4C is a block diagram illustrating an ECC unit 130 shown in FIG. 4A.

Figure 5:
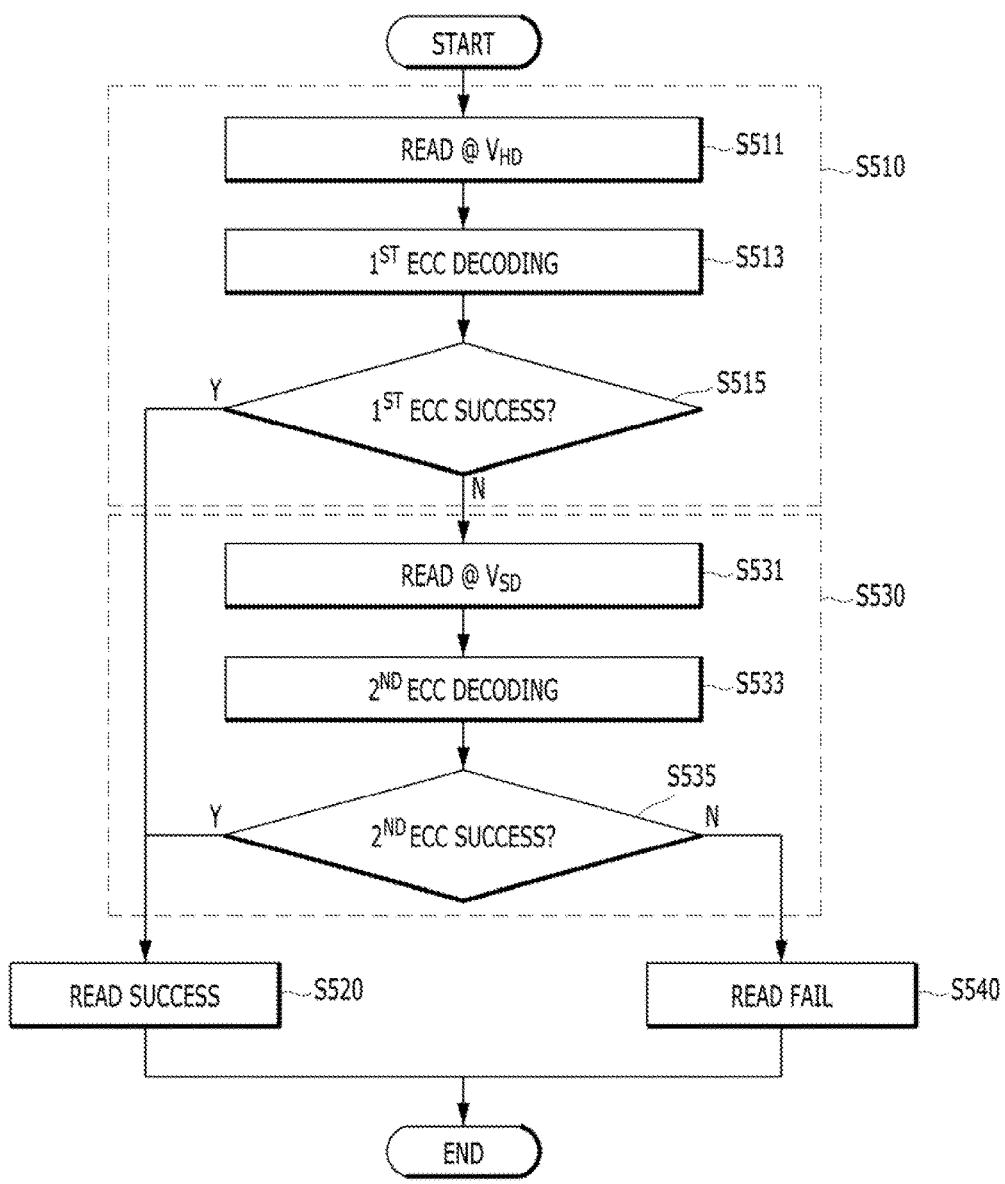
FIG. 5 is a flowchart illustrating an operation of a memory controller shown in FIG. 4A.

FIG. 5 is a flowchart illustrating an operation of a memory controller shown in FIG. 4A.

Referring FIGS. 3 to 5, the semiconductor memory system 10 may include a semiconductor memory device 200 and the memory controller 100.

The semiconductor memory device 200 may perform one or more of erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 may control overall operations of the semiconductor memory device 200. The memory controller 100 may include an ECC unit 130 for correcting error bits. The ECC unit 130 may include an ECC encoder 131 and an ECC decoder 133.

The ECC encoder 131 may perform error correction encoding on data to be programmed into the semiconductor memory device 200 to output data to which parity bits are added. The parity bits may be stored in the semiconductor memory device 200.

The ECC decoder 133 may perform error correction decoding on data read from the semiconductor memory device 200. The ECC decoder 133 may determine whether the error correction decoding is successful, and may output an instruction signal based on the determination result. The ECC decoder 133 may correct error bits of data using the parity bits generated by the ECC encoding operation.

When the number of error bits exceeds error correction capacity of the ECC unit 130, the ECC unit 130 may not correct the error bits. In this case, the ECC unit 130 may generate an error correction fall signal.

The ECC unit 130 may correct an error through a coded modulation such as a low-density parity-check (LDPC) code, a Bose-Chaudhuri-Hocquenghem (BCH) code, a turbo code, a Reed-Solomon (RS) code, a convolution code, a Recursive Systematic Code (RSC), a Trellis-Coded Modulation (TCM), a Block Coded Modulation (BCM), and so on. The ECC unit 130 may include one or more of a circuit, a system and a device for the error correction.

In accordance with an embodiment of the present invention, the ECC unit 130 may perform an error bit correction operation through a hard decision read data and a soft decision read data.

The memory controller 100 and the semiconductor memory device 200 may be integrated in a single semiconductor device. For example, the memory controller 100 and the semiconductor memory device 200 may be integrated in a single semiconductor device such as a solid-state drive (SSD). The solid state drive may include a storage device for storing data in a semiconductor memory. When the semiconductor memory system 10 is used in the SSD, operation speed of a host (not shown) coupled to the semiconductor memory system 10 may be remarkably improved.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

For another example, the semiconductor memory system 10 may be provided as one of various elements comprising an electronic device such as a computer, an ultra-mobile PC (UMPC), a workstation, a net-book computer, a personal digital assistants (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, an radio-frequency identification (RFID) device, and/or elements devices of a computing system.

Referring to FIG. 4A, the memory controller 100 may include a storage unit 110, a CPU 120, the ECC unit 130, a host interface 140, a memory interface 150 and a system bus 160. The storage unit 110 may operate as a working memory of the CPU 120.

The host interface 140 may communicate with a host through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The ECC unit 130 may detect and correct an error included in the data read from the semiconductor memory device 200. The memory interface 150 may interface with the semiconductor memory device 200. FIG. 4A shows the ECC unit 130 including both of the ECC encoder 131 and the ECC decoder 133 as an example, and the ECC encoder 131 and the ECC decoder 133 may be implemented as different and independent components. The CPU 120 may perform general various control operations.

The semiconductor memory device 200 may include a memory cell array 210, a control circuit 220, a voltage supply unit 230, a voltage transmitting unit 240, a read/write circuit 250, and a column selection unit 260.

The memory cell array 210 may include a plurality of memory blocks 211. User data may be stored in the memory block 211.

Referring to FIG. 4B, the memory block 211 may include a plurality of cell strings 221 coupled to bit lines BL0 to BLm−1, respectively. The cell string 221 of each column may include one or more drain selection transistors DST and one or more source selection transistors SST. A plurality of memory cells MC0 to MCn−1 or memory cell transistors may be serially coupled between the selection transistors DST and SST. Each of the memory cells MC0 to MCn−1 may be formed of a multi-level cell (MLC) storing data information of multiple bits therein. The cell strings 221 may be electrically coupled to the corresponding bit lines BL0 to BLm−1, respectively.

FIG. 4B exemplarily illustrates a memory block 211 including a NAND-type flash memory cell. However, the memory block 211 of the semiconductor memory device 200 will not be limited to the NAND flash memory, and may include NOR-type flash memory, hybrid flash memory in which two or more types of memory cells are combined, and one-NAND flash memory in which a controller is embedded inside a memory chip. Operation characteristics of the semiconductor device may be applied to a charge trap flash (CTF) in which a charge storing layer is formed by an insulating layer, as well as the flash memory device in which a charge storing layer is formed by a conductive floating gate.

Further, in accordance with an embodiment of the present invention, the memory block 211 of the semiconductor memory system 10 may include one or more of the Phase change RAM (PRAM), the Magnetic RAM (MRAM) and the Resistive RAM (RRAM).

The PRAM may store data according to a phase change of a phase change material layer. The PRAM may have one of the amorphous state and the polycrystalline state according to the phase transition of chalcogenide compound comprising the germanium (Ge), antimony (Sb) and the tellurium (Te). The PRAM may store data using resistance difference between the states. When steadily cooled down after heating at a relatively low temperature between the crystallization point and the melting point for a predetermined time, the phase change material may be crystallized. As such, when the crystallization of the phase change material progresses, the phase change material may enter low resistance state and store data of '0'. On the other hand, when quenched after heating at a temperature higher than the melting point, the phase change material may become amorphous. As such, when the amorphousness of the phase change material progresses, the phase change material may enter high resistance state and store data of '1'.

The MRAM may have high read and write speed and high durability with low power consumption. The MRAM may store information using magnetic material as information storage medium. The spin transfer torque random access memory (STT-MRAM) is a kind of the MRAM. The STT-MRAM may use magnetic elements, a part of which is written through a current induced thereby.

The PRAM may be the non-volatile memory device turned on and off by resistance difference caused by electrical resistance change of a material through application of external voltage to a thin film.

Referring back to FIG. 4A, the control circuit 220 may control overall operations related to program, erase, and read operations of the semiconductor memory device 200.

The voltage supply unit 230 may provide word line voltages, for example, a program voltage, a read voltage, and a pass voltage, to the respective word lines according to an operation mode, and may provide a voltage to be supplied to a bulk, for example, a well region in which the memory cells are formed. A voltage generating operation of the voltage supply circuit 230 may be performed under control of the control circuit 220.

The voltage supply unit 230 may generate a plurality of variable read voltages for generating a plurality of read data.

The voltage transmitting unit 240 may select one of the memory blocks 211 or sectors of the memory cell array 210, and may select one of the word lines of the selected memory block under the control of the control circuit 220. The voltage transmitting unit 240 may provide the word line voltage generated from the voltage supply circuit 230 to selected word lines or non-selected word lines under the control of the control circuit 220.

The read/write circuit 250 may be controlled by the control circuit 220 and may operate as a sense amplifier or a write driver according to an operation mode. For example, during a verification/normal read operation, the read/write circuit 250 may operate as a sense amplifier for reading data from the memory cell array 210. During the normal read operation, the column selection unit 260 may output the data read from the read/write circuit 250 to the outside (e.g., the memory controller 100) based on column address information. On the other hand, during the verification read operation, the read data may be provided to a pass/fail verification circuit (not illustrated) included in the semiconductor memory device 200, and be used for determining whether a program operation of the memory cell succeeds.

During the program operation, the read/write circuit 250 may operate as a write driver for driving the bit lines according to data to be stored in the memory cell array 210. During the program operation, the read/write circuit 250 may receive the data to be written in the memory cell array 210 from a buffer (not illustrated), and may drive the bit lines according to the input data. To this end, the read/write circuit 250 may include a plurality of page buffers (PB) 251 corresponding to the columns (or the bit lines) or column pairs (or bit line pairs), respectively. A plurality of latches may be included in each of the page buffers 251.

Referring to FIG. 4C, the ECC encoder 131 of the ECC unit 130 may encode a program data $DATA_{IN}$ into a program codeword $CW_{IN}$ to be stored into the memory cell array 210. For example, the program codeword $CW_{IN}$ may include the program data $DATA_{IN}$ and the error correction code (e.g., the parity bit). For example, the ECC encoder 131 may generate the program codeword $CW_{IN}$ through the BCH code forming the turbo product code (TPC).

The ECC decoder 133 of the ECC unit 130 may decode a readout codeword $CW_{OUT}$, which is read out from the memory cell array 210, into the program data $DATA_{IN}$. The readout codeword $CW_{OUT}$ may include a readout data $DATA_{OUT}$ and the error correction code. The ECC decoder 133 may perform the error correction operation to the readout data $DATA_{OUT}$ through the error correction code included in the readout codeword $CW_{OUT}$, and may provide the error-corrected readout data $DATA_{OUT}$ to the memory controller 100.

The ECC decoder 133 may include a hard decision unit 401 and a soft decision unit 403.

The hard decision unit 401 may perform a hard decision ECC decoding to the TPC code. For example, the hard decision unit 401 may perform the error correction operation to the readout codeword $CW_{OUT}$ as a TPC code message or a BCH code message, which is readout according to a hard decision read voltage $V_{HD}$, and may output an error location information $LOC_{ER}$.

The TPC code message may include a plurality of BCH code messages. The hard decision unit 401 may error-correct the TPC code message by performing the ECC decoding operation to the TPC code message by a unit of the BCH code message, and may detect an error by a unit of block. The TPC code may be the error correction code, which is capable of error-correcting data by the unit of block. The blocks of the TPC code may include a message block and a parity block. The TPC code may include a plurality of BCH codes in row and column directions. A single row BCH code and a single column BCH code may share a single block. For example, the BCH code of "n" bits in total, which includes "k" bits of user message and "m" parity bits, may error-correct "t" error bits therein.

The hard decision unit 401 may detect an error included in the TPC code message or the readout codeword $CW_{OUT}$ read out from the memory cell array 210, and may identify column and row codes of the error. The identified location of the error may be provided as the error location information $LOC_{ER}$ to the soft decision unit 403.

Further, as described later, the hard decision unit 401 may determine whether or not a miscorrection occurs in the BCH code message, which is successful in the ECC decoding operation.

When the hard decision ECC decoding of the hard decision unit 401 to the TPC code message fails, the soft decision unit 403 may perform a soft decision ECC decoding operation to the TPC code message by generating a soft decision read data from the memory cell array 210 according to soft decision read voltages $V_{SD}$. For example, the soft decision unit 403 may perform according to the soft decision read voltages $V_{SD}$ an additional read operation to the memory cell, to which the hard decision ECC decoding is performed according to the hard decision read voltages $V_{HD}$. The memory cell subject to the soft decision ECC decoding operation may correspond to the error location information $LOC_{ER}$ since the hard decision ECC decoding to the memory cell fails. The soft decision read voltages $V_{SD}$ may have different levels from the hard decision read voltages $V_{HD}$.

When the hard decision ECC decoding of the hard decision unit 401 to the TPC code message fails, the soft decision unit 403 may determine whether or not to perform the soft decision ECC decoding with current soft decision read voltages $V_{SD}$ based on error reliability to N number of error bits included in the message blocks, which are not error-corrected even by the hard decision ECC decoding operation.

As an example, when the soft decision unit 403 determines not to perform the soft ECC decoding operation with the current soft decision read voltages $V_{SD}$, the soft decision unit 403 may perform the soft decision ECC operation with another soft decision read voltages $V_{SD}$ different from the current soft decision read voltages $V_{SD}$. As another example, when the soft decision unit 403 determines not to perform the soft ECC decoding operation with the current soft decision read voltages $V_{SD}$, the soft decision unit 403 may perform the hard decision ECC operation with another hard decision read voltage $V_{HD}$ different from the current hard decision read voltage $V_{HD}$.

The N number of error bits included in the message blocks, which are not error-corrected even by the hard decision ECC decoding operation, may be the error location information $LOC_{ER}$ provided from the hard decision unit 401 and may be identified from the error location information $LOC_{ER}$ obtained from each BCH code message.

The hard decision unit 401 may include a syndrome generation section 411, an error location determination section 413, an error correction section 415 and a miscorrection determination section 417.

The syndrome generation section 411 may generate a syndrome from the readout codeword $CW_{OUT}$ through a primitive polynomial. In an example case of the BCH code message BCH (n, k, t) of "n" bits in total, which includes "k" bits of user message, "m" parity bits and "t" bits of error-correction capacity, where "n", "k", "m" and "t" satisfy a condition of "n=k+mt"; and "m" is the smallest positive integer satisfying a condition of "$2^m \geq n$", "n" bits codeword "$r_0$" to "$r_{n-1}$" of the BCH code message BCH (n, k, t) may be represented as the polynomial of equation 1. In order to determine whether or not an error is included in the readout codeword R(x), "2t" number of syndromes may be calculated through equation 2. When there is no error in the readout codeword R(x), the calculated values of the "2t" number of syndromes may be all "0".

$$R(x) = r_0 + r_1 x^1 + \ldots + r_{n-1} x^{n-1} \quad \text{[Equation 1]}$$

$$S_j = R(\alpha^j) = \sum_{i=0}^{n-1} r_i \alpha^{ji}, (0 \leq j \leq 2t) \quad \text{[Equation 2]}$$

The error location determination section 413 may generate the error location information $LOC_{ER}$ by identifying the row and column codes of the error through application of the Berlekamp Massey algorithm and the Chien Search algorithm to the syndromes, each value of which is not "0".

FIG. 6 is an example diagram illustrating the TPC code message.

FIG. 6 exemplarily shows 8×8 TPC code message having four 4 errors. Each row and column may represent the BCH code message.

FIG. 6 exemplarily shows a case that the BCH code messages of third and sixth rows and second and seventh columns fail in the hard decision ECC decoding of the hard decision unit 401 as a result of the hard decision ECC decoding to BCH code messages of all rows and columns in the TPC code message.

The hard decision unit 401 may generate the error location information $LOC_{ER}$ by generating the syndrome for each of BCH code messages of all rows and columns and identifying the message blocks of the error at the locations of second row-third column, second row-sixth column, seventh row-third column, and seventh row-sixth column.

Referring back to FIG. 4C, the error correction section 415 may perform the error-correction operation to the TPC code message based on the error location information $LOC_{ER}$ provided from the error location determination section 413.

The miscorrection determination section 417 may determine whether or not the miscorrection occurs in the BCH code message, to which the hard decision ECC decoding is successful. In a case that the error-correction capability of the BCH code message is "T" bits, a probability of the miscorrection may increase when "2T" number or more errors are included in the BCH code message.

Figure 7A:
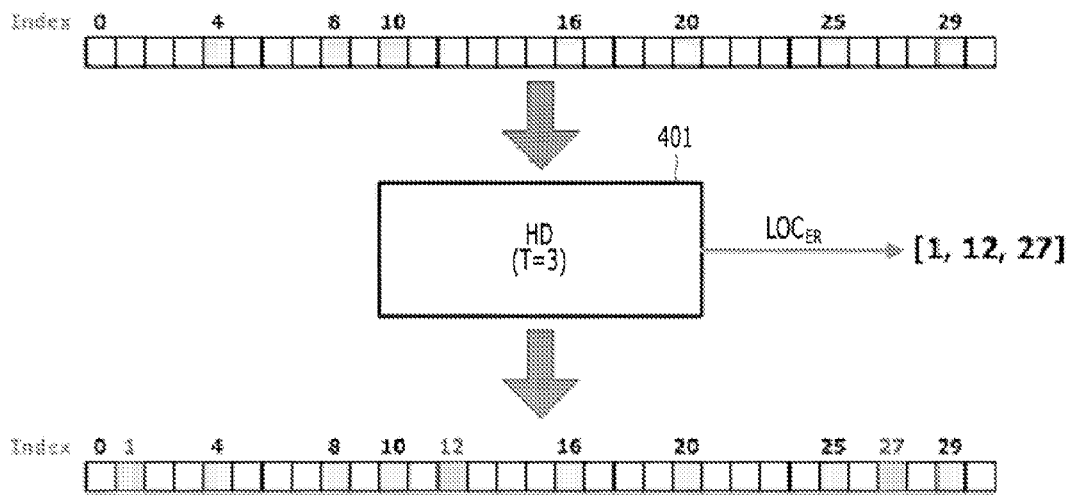
FIG. 7A is an example diagram illustrating a miscorrected BCH code message.

FIG. 7A is an example diagram illustrating a miscorrected BCH code message.

In an example case of the BCH code message has 31 bits in total and has 3 bits of the error-correction capacity, when seven bits errors are included at locations [4, 8, 10, 16, 20, 25, 29] (i.e., $4^{th}$, $8^{th}$, $10^{th}$, $16^{th}$, $20^{th}$, $25^{th}$, and $29^{th}$ bits) of the readout codeword $CW_{OUT}$, the number of errors may be beyond the error-correction capacity of the BCH code message and thus the hard decision ECC decoding to the readout codeword $CW_{OUT}$ should be determined as failed. However, the error bits beyond the error-correction capacity of the BCH code message may not be precisely detected by general BCH decoding scheme and an ECC decoder may try to error-correct the error bits beyond the error-correction capacity. As a result of the erroneous try, it may be erroneously determined that error bits are included at "wrong" locations [1, 12, 27] and the error bits of the erroneously determined locations (i.e., $1^{st}$, $12^{th}$, and $27^{th}$ bits) may be error-corrected through bit-flip, which further results in an increase of errors. As such, the miscorrection refers to as the success determination of the hard decision ECC decoding with increased number of the error bits due to the erroneous try of error-correction instead of the failure determination of the hard decision ECC decoding when the error bits beyond the error-correction capacity of the BCH code message are included in the readout codeword $CW_{OUT}$.

Referring back to FIG. 4C, the miscorrection determination section 417 may obtain a soft decision information (e.g., the log likelihood ratio (LLR)) which provides reliability to the hard decision read data or the readout codeword $CW_{OUT}$ readout according to the hard decision read voltage $V_{HD}$ by performing additional read operation through the soft decision read voltages $V_{SD}$ to the memory cells corresponding to the error location information $LOC_{ER}$ (i.e., the "wrong" locations [1, 12, 27] of the above described example) of the BCH code message of the successful hard decision ECC decoding. When the BCH code message of the successful hard decision ECC decoding is the miscorrected BCH code message, the message block corresponding to the error location information $LOC_{ER}$ is highly likely to be substantially the one without the error and thus absolute values of the soft decision information of the memory cells corresponding to the error location information $LOC_{ER}$ are highly likely to be great.

In accordance with an embodiment of the present invention, the miscorrection determination section 417 may determine the miscorrection of the BCH code message of the successful hard decision ECC decoding through the soft decision information of the memory cells corresponding to the error location information $LOC_{ER}$ of the BCH code message.

In detail, in an example case that the error location information $LOC_{ER}$ of the N number of the error bits included in the BCH code message of the successful hard decision ECC decoding are $[n_1, n_2, \ldots, n_N]$ and the soft decision information of the N number of the errors are [$SV_1$, $SV_2$, ..., $SV_N$], error reliability $REL_{ER}$ of the BCH code message of the successful hard decision ECC decoding may be represented by equation 3.

$$REL_{ER} = \text{abs}(SV_1) + \text{abs}(SV_2) + \ldots + \text{abs}(SV_N) \quad \text{[Equation 3]}$$

When the error reliability $REL_{ER}$ is greater than a first reliability threshold $REL_{TH1}$, the BCH code message of the successful hard decision ECC decoding may be determined as miscorrected. This is the reason the message block corresponding to the error location information $LOC_{ER}$ is highly likely to be substantially the one without the error and thus the absolute values of the soft decision information of the memory cells corresponding to the error location information $LOC_{ER}$ are highly likely to be great when the BCH code message of the successful hard decision ECC decoding is the miscorrected BCH code message, as described above. On the other hand, when the error reliability $REL_{ER}$ is equal to or less than the first reliability threshold $REL_{TH1}$, the BCH code message of the successful hard decision ECC decoding may be determined as normally successful in the hard decision ECC decoding.

The first reliability threshold $REL_{TH1}$ may be proportional to N number of the error bits included in the BCH code message of the successful hard decision ECC decoding, as represented by equation 4.

$$REL_{TH1} = N*P \quad \text{[Equation 4]}$$

The parameter P of equation 4 may be adjustable and heuristically obtained. For example, a value of the parameter P may be 0.5.

Figure 7B:
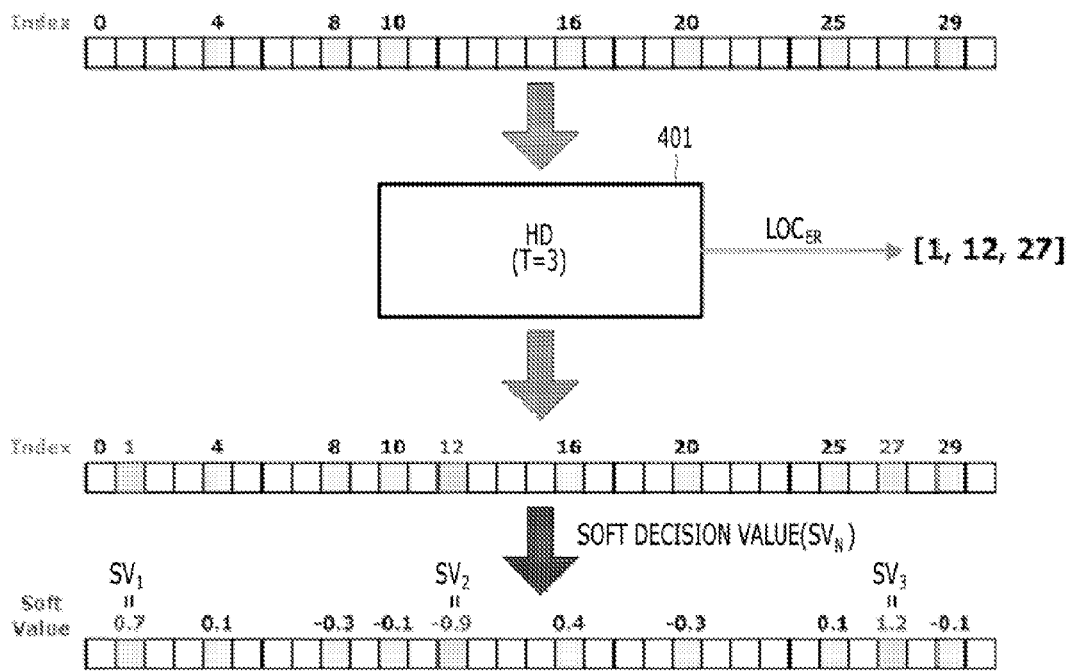
FIG. 7B is an example diagram illustrating a determination operation of a miscorrection of a BCH code message in accordance with an embodiment of the present invention.

FIG. 7B is an example diagram illustrating a determination operation of the miscorrection of the BCH code message in accordance with an embodiment of the present invention.

As exemplified in FIG. 7B, in the case that the N number of the error bits of the BCH code message of the successful hard decision ECC decoding is 3, the error location information $LOC_{ER}$ is [1, 12, 27], and the soft decision information of the memory cells corresponding the error bits is [0.7, −0.9, 1.2], the error reliability $REL_{ER}$ may be 2.8 (abs(+0.7)+abs(−0.9)+abs(+1.2)) greater than a value 1.5 (3*0.5) of the first reliability threshold $REL_{TH1}$ and therefore, the BCH code message of the successful hard decision ECC decoding may be determined as miscorrected.

Referring to FIGS. 4A to 5, the operation of the memory controller 100 may include a first ECC decoding step S510, and may additionally include a second ECC decoding step S530.

For example, the first ECC decoding step S510 may be a step of a hard decision ECC decoding for the hard decision read data or a codeword $CW_{OUT}$ of predetermined length, which is read from a memory cell of the memory block 211 according to the hard decision read voltage $V_{HD}$. The first ECC decoding step S510 may include steps S511 to S515.

As to the TPC code message, the memory controller 100 may perform the first ECC decoding step S510 on each of all BCH code messages included in the TPC code message.

For example, the second ECC decoding step S530 may be a step of the soft decision ECC decoding for the hard decision read data by forming the soft decision read data according to the soft decision read voltages $V_{SD}$ around the hard decision read voltage $V_{HD}$ when the hard decision ECC decoding of the first ECC decoding step S510 finally fails. The second ECC decoding step S530 may include steps S531 to S535.

As to the TPC code message, the memory controller 100 may perform the second ECC decoding step S530 when one or more errors of the TPC code message are not error-corrected even though the memory controller 100 performs the first ECC decoding step S510 on all BCH code messages included in the TPC code message.

As described above, at step S511 of the hard decision read step, the hard decision read data or the codeword $CW_{OUT}$ may be read from the semiconductor memory device 200 according to the hard decision read voltages $V_{HD}$. The memory controller 100 may provide a read command and an address to the semiconductor memory device 200. The semiconductor memory device 200 may read the hard decision read data or the codeword $CW_{OUT}$ therefrom according to the hard decision read voltages $V_{HD}$ in response to the read command and the address. The read hard decision read data or the read codeword $CW_{OUT}$ may be provided to the memory controller 100.

At step S513, the hard decision ECC decoding as the first ECC decoding may be performed. The ECC unit 130 may perform the hard decision ECC decoding to the hard decision read data or the codeword $CW_{OUT}$, which is read from the semiconductor memory device 200 according to the hard decision read voltages $V_{HD}$, by using an error correction code included in the hard decision read data or the codeword $CW_{OUT}$.

At step S515, it may be determined whether the hard decision ECC decoding succeeds or fails. That is, at step S515, it may be determined whether or not an error of the hard decision read data, to which the hard decision ECC decoding is performed at step S513, is corrected.

When it is determined that the hard decision read data, to which the hard decision ECC decoding is performed, is corrected as the result of determination of step S515, it may be determined at step S520 that the read operation according to hard decision read voltage $V_{HD}$ at step S511 is successful and the operation of the memory controller 100 may end. The hard decision read data, to which the hard decision ECC decoding is performed at step S513, may be now the error-corrected data and may be provided to the external or used in the memory controller 100.

When it is determined that the hard decision read data, to which the hard decision ECC decoding is performed, is not corrected as the result of determination of step S515, the second ECC decoding step S530 may be performed.

As described above, at step S531 of the soft decision read step, the soft decision read data may be read from the semiconductor memory device 200 according to the soft decision read voltages $V_{SD}$. For example, the additional read operation according to the soft decision read voltages $V_{SD}$ may be performed to the memory cell, to which the first ECC decoding step S510 is performed according to the hard decision read voltages $V_{HD}$. The soft decision read voltages $V_{SD}$ may have different levels from the hard decision read voltages $V_{HD}$.

At step S533, the soft decision ECC decoding as the second ECC decoding may be performed. The soft decision ECC decoding may be performed based on the soft decision read data including the hard decision read data, to which the hard decision ECC decoding is performed, and data read from the memory cell according to the soft decision read voltages $V_{SD}$. The hard decision read voltages $V_{HD}$ and the soft decision read voltages $V_{SD}$ may have different levels.

For example, each of the memory cells MC0 to MCn−1 of the semiconductor memory device 200 may belong to one of the threshold voltage distributions including seven program states P1 to P7 and one erase state E.

Each of the hard decision read voltages $V_{HD}$ may have the level between neighbouring two of the plurality of states (E and P1 to P7). Each of the soft decision read voltages $V_{SD}$ may have the level between neighbouring two of the plurality of states (E and P1 to P7), which is different from the hard decision read voltages $V_{HD}$.

The hard decision read data read from the memory cells MC0 to MCn−1 according to the hard decision read voltages $V_{HD}$ and the soft decision read data read therefrom according to the soft decision read voltages $V_{SD}$ may have different values from each other. For example, there may be a tailed one of the memory cells MC0 to MCn−1 having the threshold voltage higher or lower than the threshold voltage distribution of the normal logic state. The hard decision read data read from the tailed memory cell according to the hard decision read voltages $V_{HD}$ and the soft decision read data read therefrom according to the soft decision read voltages $V_{SD}$ may have different values from each other. When the additional read operation according to the soft decision read voltages $V_{SD}$ is performed as well as the read operation according to the hard decision read voltages $V_{HD}$, obtained may be additional information on the threshold voltages of the memory cells MC0 to MCn−1 (i.e., additional information on the tailed memory cells), or the log likelihood ratio (LLR) providing reliability to the hard decision read data read by the hard decision read operation.

When the additional information is obtained, the probability of the likelihood ratio whether the data of the memory cells MC0 to MCn−1 belong to the first state (i.e., '1'), or the second state (i.e., '0'), may increase. That is, the reliability of the ECC decoding may increase. The memory controller 100 may perform the soft decision ECC decoding based on the soft decision read data, which is read according to the hard decision read voltage $V_{HD}$ and the soft decision read voltages $V_{SD}$.

At step S535, it may be determined whether the soft decision ECC decoding succeeds or fails. That is, at step S535, it may be determined whether or not an error of the soft decision read data, to which the soft decision ECC decoding is performed at step S533, is corrected.

When it is determined that the soft decision read data, to which the soft decision ECC decoding is performed, is corrected as the result of determination of step S535, it may be determined at step S520 that the read operation according to soft decision read voltage $V_{SD}$ at step S531 is successful and the operation of the memory controller 100 may end. The soft decision read data, to which the soft decision ECC decoding is performed at step S533, may be now the error-corrected data and may be provided to the external or used in the memory controller 100.

When it is determined that the soft decision read data, to which the soft decision ECC decoding is performed, is not corrected as the result of determination of step S535, it may be determined at step S540 that the read operation of the memory controller 100 to the memory cells MC0 to MCn−1 finally fails and the operation of the memory controller 100 may end.

Figure 8A:
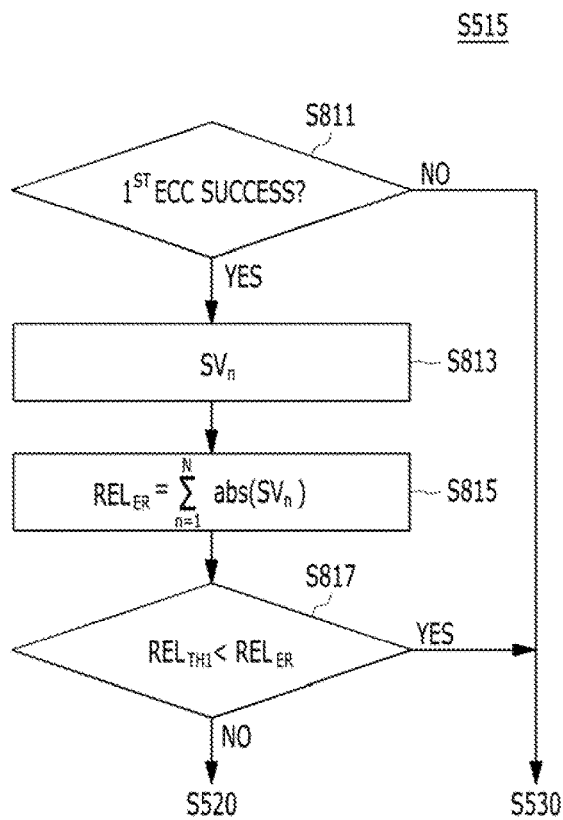
FIG. 8A is a flowchart illustrating step S515 shown in FIG. 5.

FIG. 8A is a flowchart illustrating step S515 shown in FIG. 5.

Referring to FIG. 8A, at step S811, it may be determined whether or not the hard decision ECC decoding is successful for each of the BCH code messages included in the TPC code message. That is, it may be determined whether or not the BCH code message is error-corrected as the result of the hard decision ECC decoding at step S811.

When the hard decision ECC decoding of step S513 to the BCH code message is determined to fail as the result of the determination of step S811, the first ECC decoding step S510 may be performed to another BCH code message of the TPC code message. When the TPC code message is not error-corrected even with the first ECC decoding step S510 to all BCH code messages of the TPC code message, the second ECC decoding step S530 may be performed.

When the hard decision ECC decoding of step S513 to the BCH code message is determined as successful as the result of the determination of step S811, step S813 may be performed.

At step S813, the soft decision information $SV_n$ may be obtained for each of N number of error-corrected bits in the BCH code message of the successful hard decision ECC decoding.

At step S815, the error reliability $REL_{ER}$ may be obtained on the basis of all of the N number of the soft decision information $SV_n$ according to equation 3.

At step S817, the error reliability $REL_{ER}$ of step S815 may be compared with the first reliability threshold $REL_{TH1}$ represented by equation 4.

When the error reliability $REL_{ER}$ is greater than the first reliability threshold $REL_{TH1}$ ('YES') as a result of comparison at S817, the BCH code message of the successful hard decision ECC decoding may be determined as miscorrected. That is, the BCH code message of the successful hard decision ECC decoding of step S811 may be the miscorrected message and thus substantially may be determined as the message that fails in the hard decision ECC decoding of step S811. Therefore, the flipped bits for the error-correction at the hard decision ECC decoding of step S811 may be restored to have the original value. Also, the first ECC decoding step S510 may be performed to another BCH code message of the TPC code message. When the TPC code message is not error-corrected even with the first ECC decoding step S510 to all BCH code messages of the TPC code message, the second ECC decoding step S530 may be performed.

When the error reliability $REL_{ER}$ is equal to or less than the first reliability threshold $REL_{TH1}$ ('NO') as the result of comparison at S817, the BCH code message of the successful hard decision ECC decoding of step S811 may be determined as normally successful in the hard decision ECC decoding. Therefore, the first ECC decoding step S510 may be performed to another BCH code message of the TPC code message. When the TPC code message is not error-corrected even with the first ECC decoding step S510 to all BCH code messages of the TPC code message, the second ECC decoding step S530 may be performed.

When the TPC code message is error-corrected with the first ECC decoding step S510 to all BCH code message of the TPC code message, it may be determined at step S520 that the read operation according to hard decision read voltage $V_{HD}$ at step S511 is successful and the operation of the memory controller 100 may end. The hard decision read data, to which the hard decision ECC decoding is performed at step S513, may be now the error-corrected data and may be provided to the external or used in the memory controller 100.

Figure 8B:
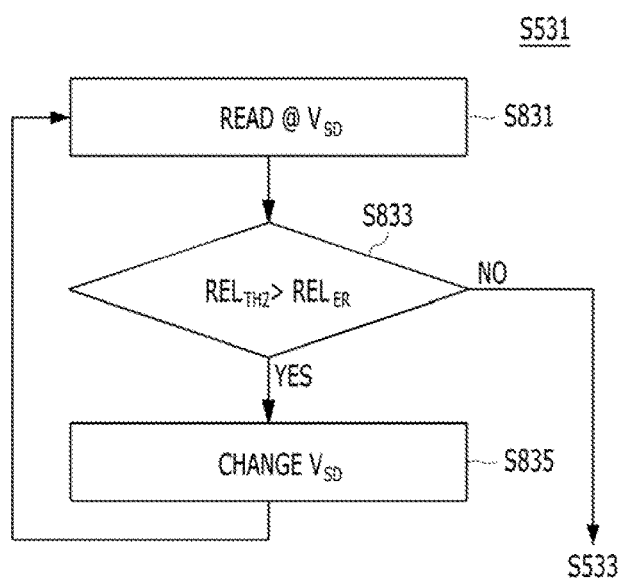
FIG. 8B is a flowchart illustrating step S531 shown in FIG. 5.

FIG. 8B is a flowchart illustrating step S531 shown in FIG. 5.

Referring to FIG. 8B, at step S831, the soft decision read data may be read from the semiconductor memory device 200 according to the soft decision read voltages $V_{SD}$. For example, the additional read operation according to the soft decision read voltages $V_{SD}$ may be performed to the memory cell, to which the first ECC decoding step S510 is performed according to the hard decision read voltages $V_{HD}$.

At step S833, the error reliability $REL_{ER}$ of N number of error bits included in the message blocks, which are not error-corrected even by the first ECC decoding step S510, may be compared with a second reliability threshold $REL_{TH2}$. The N number of error bits included in the message blocks may be identified from the error location information $LOC_{ER}$ obtained from each BCH code message at the first ECC decoding step S510.

When the error reliability $REL_{ER}$ is greater than the second reliability threshold $REL_{TH2}$ ('NO') as a result of comparison at S833, the error reliability $REL_{ER}$ may be determined as sufficiently great and thus the soft decision ECC decoding step S533 may be performed.

When the error reliability $REL_{ER}$ is less than the second reliability threshold $REL_{TH2}$ ('YES') as the result of comparison at S833, the error reliability $REL_{ER}$ obtained according to the current soft decision read voltages $V_{SD}$ may be determined to be insufficient. In this case, it may take too much resources or may be meaningless to perform the soft decision ECC decoding of step S535 to the current soft decision read data.

Therefore, at step S835, the current soft decision read voltages $V_{SD}$ may be changed to another soft decision read voltages $V_{SD}$ without performing the soft decision ECC decoding to the current soft decision read data. And then, an additional read operation may be performed with the changed soft decision read voltages $V_{SD}$ at step S831. When the additional read operation according to the changed soft decision read voltages $V_{SD}$ is performed, obtained may be additional information on the threshold voltages of the memory cells MC0 to MCn−1 (i.e., additional information on the tailed memory cells), or the log likelihood ratio (LLR) additionally providing reliability to the soft decision read data read by the soft decision read operation according to the previous soft decision read voltages $V_{SD}$ before the change. When the error reliability $REL_{ER}$ of the soft decision read data, which is obtained through the additional read operation according to the changed soft decision read voltages $V_{SD}$, is greater than the second reliability threshold $REL_{TH2}$ ('NO') as the result of comparison at S833, the error reliability $REL_{ER}$ may be determined as sufficiently great and thus the soft decision ECC decoding step S533 may be performed.

Therefore, the soft decision ECC decoding of step S535 to the current soft decision read data taking too much resources or being meaningless may be prevented.

Figure 8C:
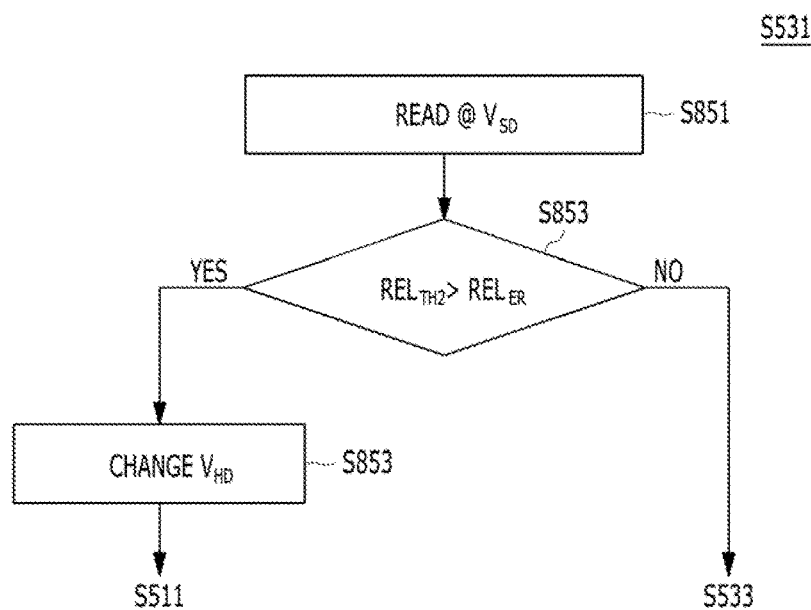
FIG. 8C is a flowchart illustrating step S531 shown in FIG. 5.

FIG. 8C is a flowchart illustrating step S531 shown in FIG. 5.

During step S531 of FIG. 8C, the hard decision read voltage $V_{HD}$ may be changed, which is different from step S531 described with reference to FIG. 8B.

Referring to FIG. 8C, at step S851, the soft decision read data may be read from the semiconductor memory device 200 according to the soft decision read voltages $V_{SD}$. For example, the additional read operation according to the soft decision read voltages $V_{SD}$ may be performed to the memory cell, to which the first ECC decoding step S510 is performed according to the hard decision read voltages $V_{HD}$.

At step S853, the error reliability $REL_{ER}$ of N number of error bits included in the message blocks, which are not error-corrected even by the first ECC decoding step S510, may be compared with a second reliability threshold $REL_{TH2}$. The N number of error bits included in the message blocks may be identified from the error location information $LOC_{ER}$ obtained from each BCH code message at the first ECC decoding step S510.

When the error reliability $REL_{ER}$ is greater than the second reliability threshold $REL_{TH2}$ ('NO') as a result of comparison at S853, the error reliability $REL_{ER}$ may be determined as sufficiently great and thus the soft decision ECC decoding step S533 may be performed.

When the error reliability $REL_{ER}$ is less than the second reliability threshold $REL_{TH2}$ ('YES') as the result of comparison at S853, the error reliability $REL_{ER}$ obtained according to the current soft decision read voltages $V_{SD}$ may be determined to be insufficient. In this case, it may take too much resources or may be meaningless to perform the soft decision ECC decoding of step S535 to the current soft decision read data.

Therefore, at step S853, the current hard decision read voltage $V_{HD}$ may be changed to another hard decision read voltage $V_{HD}$ without performing the soft decision ECC decoding to the current soft decision read data. And then, the operation of the memory controller 100 may be performed again from the first ECC decoding step S510.

Therefore, the soft decision ECC decoding of step S535 to the current soft decision read data taking too much resources or being meaningless may be prevented.

In accordance with exemplary embodiments of the present invention, the memory controller 100 may avoid the miscorrection as well as the soft decision ECC decoding operation, which takes too much resources or is meaningless.

Figure 9:
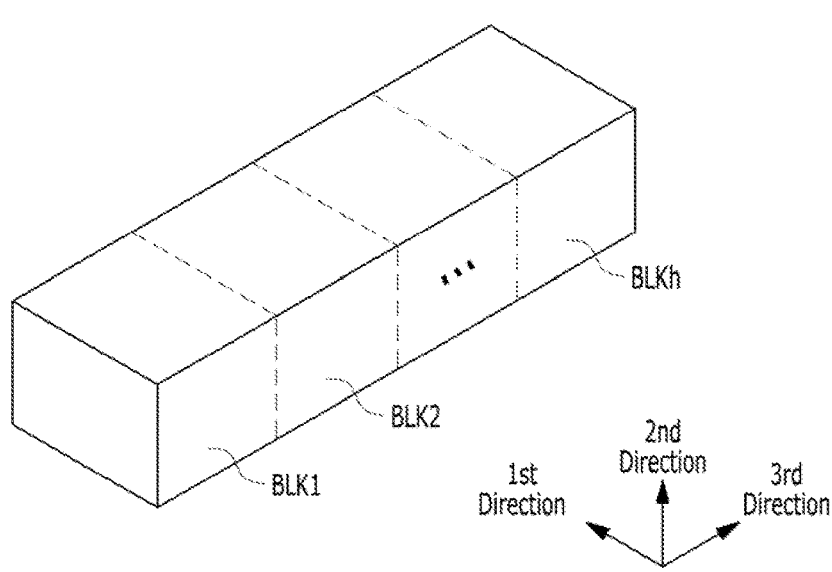
FIGS. 9, 10, 11, 12, and 13 are diagrams schematically illustrating a three-dimensional (3D) non-volatile memory device in accordance with an embodiment of the present invention.

FIG. 9 is a block diagram of the memory cell array 210 shown in FIG. 4B.

Referring to FIG. 9, the memory cell array 210 may include a plurality of memory blocks BLK1 to BLKh. Each of the memory blocks BLK1 to BLKh may have a 3D structure or a vertical structure. For example, each of the memory blocks BLK1 to BLKh may include a structure extending along first to third directions.

Each of the memory blocks BLK1 to BLKh may include a plurality of NAND strings NS extending along the second direction. A plurality of NAND strings NS may be provided along the first and third directions. Each of the NAND strings NS may be coupled to a bit line BL, one or more string select lines SSL, one or more ground select lines GSL, a plurality of word lines WL, one or more dummy word lines DWL, and a common source line CSL. That is, each of the memory blocks BLK1 to BLKh may be coupled to a plurality of bit lines BL, a plurality of string select lines SSL, a plurality of ground select lines GSL, a plurality of word lines WL, a plurality of dummy word lines DWL, and a plurality of common source lines CSL.

Figure 10:
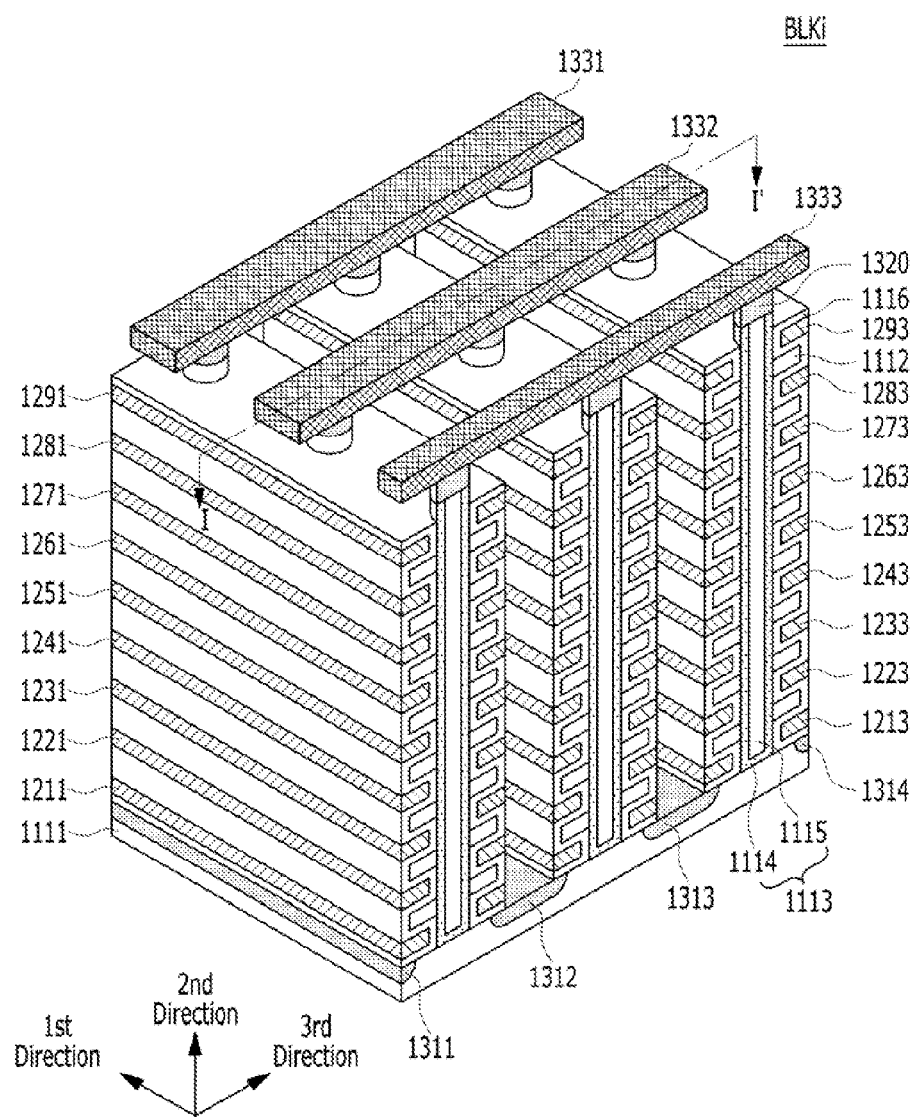
Figure 11:
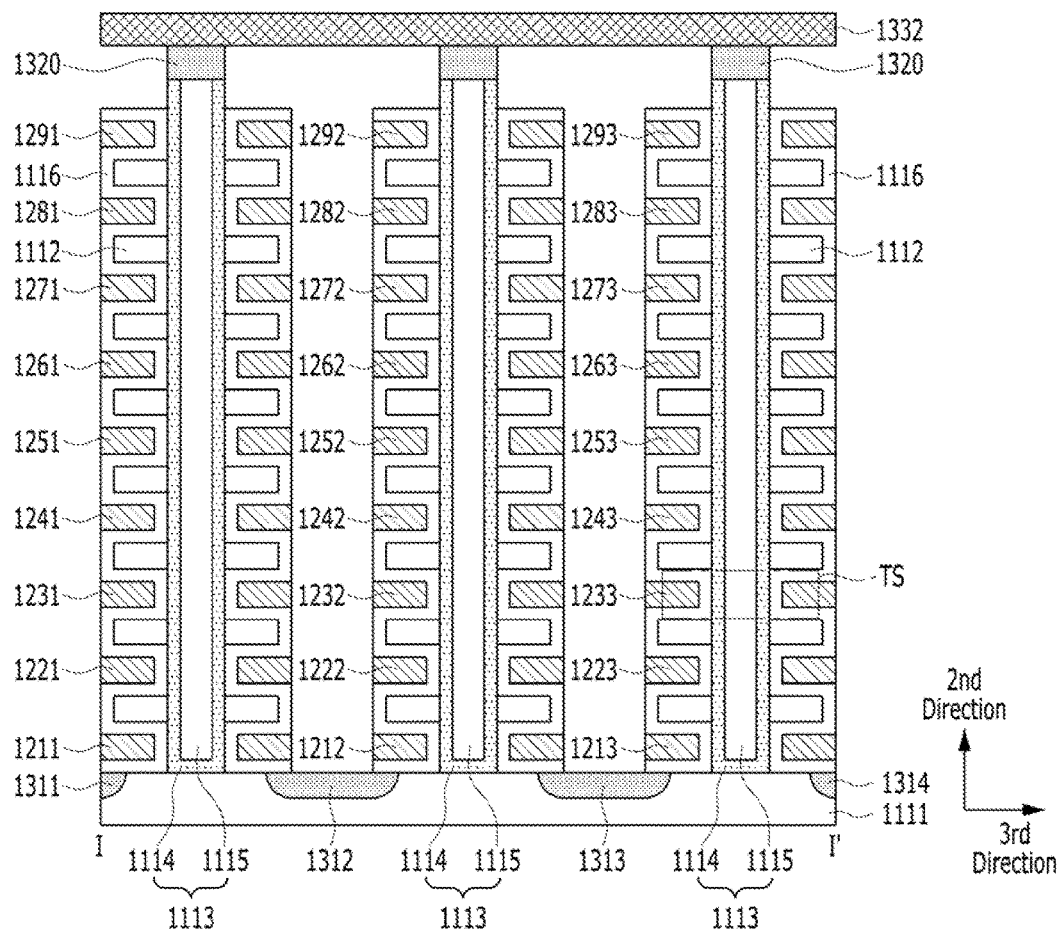

FIG. 10 is a perspective view of one memory block BLKi of the memory blocks BLK1 to BLKh shown in FIG. 9. FIG. 11 is a cross-sectional view taken along a line I-I' of the memory block BLKi shown in FIG. 10.

Referring to FIGS. 10 and 11, the memory block BLKi may include a structure extending along first to third directions.

A substrate 1111 may be provided. For example, the substrate 1111 may include a silicon material doped by a first type impurity. For example, the substrate 1111 may include a silicon material doped by a p-type impurity or a p-type well (e.g., a pocket p-well). The substrate 1111 may further include an n-type well surrounding the p-type well. In the description, it is exemplarily assumed that the substrate 1111 is p-type silicon. However, the substrate 1111 will not be limited to p-type silicon.

A plurality of doping regions 1311 to 1314 extending along the first direction may be provided over the substrate 1111. For example, the plurality of doping regions 1311 to 1314 may have a second type impurity differing from that of the substrate 1111. For example, the plurality of doping regions 1311 to 1314 may be doped with an n-type impurity. In the description, it is exemplarily assumed that the first to fourth doping regions 1311 to 1314 are of n-type. However, the first to fourth doping regions 1311 to 1314 will not be limited to n-type.

A plurality of insulation materials 1112 extending along the first direction may be sequentially provided along the second direction over a region of the substrate 1111 between the first and second doping regions 1311 and 1312. For example, the plurality of insulation materials 1112 and the substrate 1111 may be spaced apart by a predetermined distance in the second direction. In a second example, the plurality of insulation materials 1112 may be spaced apart from each other in the second direction. In a third example, the insulation materials 1112 may include an insulator such as silicon oxide.

A plurality of pillars 1113 may be sequentially provided along the first direction over a region of the substrate 111 between the first doping region 1311 and the second doping region 1312, and may be formed to penetrate the insulation materials 1112 along the second direction. For example, each of the pillars 1113 may penetrate the Insulation materials 1112 to contact the substrate 1111. For example, each of the pillars 1113 may be composed of a plurality of materials. A surface layer 1114 of each of the pillars 1113 may include a silicon material having a first type. The surface layer 1114 of each of the pillars 1113 may include a silicon material doped with the same type impurity as that of the substrate 1111. In the description, it is exemplarily assumed that the surface layer 1114 of each of the pillars 1113 includes p-type silicon. However, the surface layer 1114 of each of pillars 1113 will not be limited to include p-type silicon.

An inner layer 1115 of each of the pillars 1113 may be formed of an insulation material. For example, the inner layer 1115 of each of the pillars 1113 may be filled with an insulation material such as silicon oxide.

In a region between the first and second doping regions 1311 and 1312, an insulation layer 1116 may be provided along exposed surfaces of the insulation materials 1112, the pillars 1113, and the substrate 1111. For example, the thickness of the insulation layer 1116 may be less than half of the distance between the insulation materials 1112. That is, a region in which a material other than the insulation materials 1112 and the insulation layer 1116 is disposed may be provided between (i) the insulation layer 1116 provided over the bottom surface of a first insulation material of the insulation materials 1112 and (ii) the insulation layer 1116 provided over the top surface of a second insulation material of the insulation materials 1112. The first insulation material of the insulation materials 1112 may be disposed over the second insulation material of the insulation materials 1112.

In the region between the first and second doping regions 1311 and 1312, conductive materials 1211 to 1291 may be provided over the surface of the insulation layer 1116. For example, the conductive material 1211 extending along the first direction may be provided between the substrate 1111 and the insulation materials 1112 adjacent to the substrate 1111. More specifically, the conductive material 1211 extending along the first direction may be provided between (i) the insulation layer 1116 disposed at the bottom surface of the insulation materials 1112 adjacent to the substrate 1111 and (ii) the insulation layer 1116 disposed over the substrate 1111.

A conductive material extending along the first direction may be provided between (i) the insulation layer 1116 disposed at the top surface of a first specific insulation material among the insulation materials 1112 and (ii) the insulation layer 1116 disposed at the bottom surface of a second specific insulation material among the insulation materials 1112, which is disposed over the first specific insulation material 1112. For example, a plurality of conductive materials 1221 to 1281 extending along the first direction may be provided between the insulation materials 1112. Also, a conductive material 1291 extending along the first direction may be provided over the uppermost insulation materials 1112. For example, the conductive materials 1211 to 1291 extending along the first direction may be a metallic material. In another example, the conductive materials 1211 to 1291 extending along the first direction may be a conductive material such as polysilicon.

The same structure as the structure disposed between the first and second doping regions 1311 and 1312 may be provided between the second and third doping regions 1312 and 1313. For example, the plurality of insulation materials 1112 extending along the first direction, the plurality of pillars 1113 which are sequentially arranged in the first direction and penetrate the plurality of insulation materials 1112 along the second direction, the insulation layer 1116 provided over the surfaces of the plurality of insulation materials 1112 and the plurality of pillars 1113, and the plurality of conductive materials 1212 to 1292 extending along the first direction may be provided between the second and third doping regions 1312 and 1313.

The same structure as disposed between the first and second doping regions 1311 and 1312 may be provided between the third and fourth doping regions 1313 and 1314. For example, the plurality of insulation materials 1112 extending along the first direction, the plurality of pillars 1113 which are sequentially arranged in the first direction and penetrate the plurality of insulation materials 1112 along the second direction, the insulation layer 1116 provided over the surfaces of the plurality of insulation materials 1112 and the plurality of pillars 1113, and the plurality of conductive materials 1213 to 1293 extending along the first direction may be provided between the third and fourth doping regions 1313 and 1314.

Drains 1320 may be provided over the plurality of pillars 1113, respectively. For example, the drains 1320 may be a silicon material doped with a second type material. For example, the drains 1320 may be a silicon material doped with an n-type material. In the description, it is exemplarily assumed that the drains 320 are a silicon material doped with an n-type material. However, the drains 320 are not limited to being n-type silicon materials. For example, the width of the drains 1320 may be wider than that of a corresponding one of the pillars 1113. For example, the drains 1320 may be provided over a top surface of the corresponding one of the pillars 1113, in a pad shape.

Conductive materials 1331 to 1333 extending in the third direction may be provided over the drains 1320. The conductive materials 1331 to 1333 may be sequentially disposed along the first direction. The conductive materials 1331 to 1333 may be respectively coupled to the drains 1320 in the corresponding region. For example, the drains 1320 and the conductive material 1333 extending along the third direction may be coupled to each other through contact plugs, respectively. For example, the conductive materials 1331 to 1333 extending along the third direction may be a metallic material. In another example, the conductive materials 1331 to 1333 may be a conductive material such as polysilicon.

Referring to FIGS. 10 and 11, each of the pillars 1113 may be coupled to the insulation layer 1116 and the plurality of conductive materials 1211 to 1291, 1212 to 1292, and 1213 to 1293 extending along the first direction, to form a string.

For example, each of the pillars 1113 may form a NAND string NS together with the insulation layer 1116 and the conductive materials 1211 to 1291, 1212 to 1292, and 1213 to 1293 extending along the first direction. The NAND string NS may include a plurality of transistor structures TS.

Figure 12:
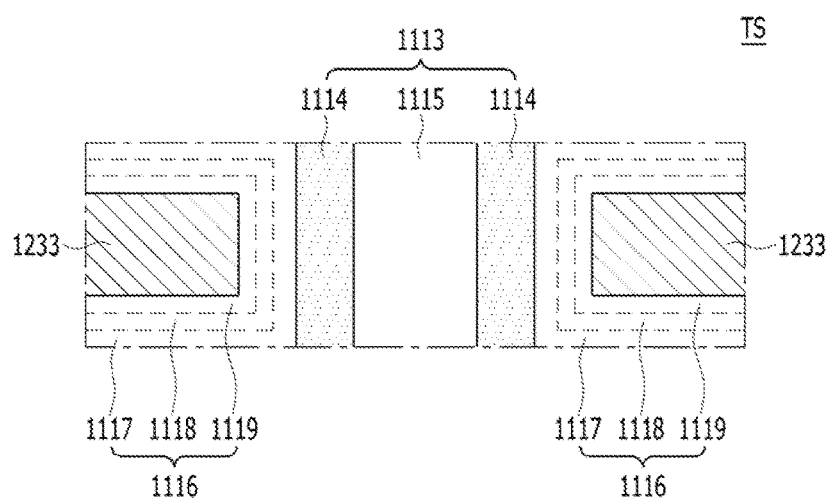

FIG. 12 is a cross-sectional view of the transistor structure TS shown in FIG. 11.

Referring to FIGS. 10 to 12, the insulation layer 1116 may include first to third sub insulation layers 1117, 1118 and 1119.

The surface layer 1114 of P-type silicon in each of the pillars 1113 may serve as a body. The first sub insulation layer 1117, adjacent to each of the pillars 1113, may serve as a tunnelling insulation layer. For example, the first sub insulation layer 1117, adjacent to the each of the plural pillars 1113, may include a thermal oxide layer.

The second sub insulation layer 1118 may serve as a charge storage layer. For example, the second sub insulation layer 1118 may serve as a charge trap layer. The second sub insulation layer 1118 may include a nitride layer or a metal oxide layer (e.g., aluminium oxide layer, hafnium oxide layer, etc.).

The third sub insulation layer 1119, adjacent to a conductive material 1233, may serve as a blocking insulation layer. For example, the third sub insulation layer 1119, adjacent to the conductive material 1233 extending along the first direction, may have a mono-layered or multi-layered structure. The third sub insulation layer 1119 may be a high dielectric layer (e.g., aluminium oxide layer, hafnium oxide layer, etc.) having a dielectric constant greater than the first and second sub insulation layers 1117 and 1118.

The conductive material 1233 may serve as a gate or control gate. That is, the gate or control gate 1233, the blocking insulation layer 1119, the charge trap layer 1118, the tunnelling insulation layer 1117, and the body 1114 may form a transistor or memory cell transistor structure. For example, the first to third sub insulation layers 1117 to 1119 may form an oxide-nitride-oxide (ONO) structure. In the description, the surface layer 1114 of p-type silicon in each of the pillars 1113 may be referred to as a body extending in the second direction.

The memory block BLKi may include the plurality of pillars 1113. That is, the memory block BLKi may include the plurality of NAND strings NS. More specifically, the memory block BLKi may include the plurality of NAND strings NS extending along the second direction or a direction perpendicular to the substrate 1111.

Each of the NAND strings NS may include the plurality of transistor structures TS, which are stacked in the second direction. One or more of the plurality of transistor structures TS of each NAND string NS may serve as a string select transistor SST. One or more of the plurality of transistor structures TS of each NAND string may serve as a ground select transistor GST.

The gates or control gates may correspond to the conductive materials 1211 to 1291, 1212 to 1292, and 1213 to 1293 extending along the first direction. That is, the gates or control gates may extend along the first direction to form word lines WL and two or more select lines (e.g., one or more string select line SSL and one or more ground select line GSL).

The conductive materials 1331 to 1333 extending along the third direction may be coupled to one end of the NAND strings NS. For example, the conductive materials 1331 to 1333 extending along the third direction may serve as bit lines BL. That is, in one memory block BLKi, a single bit line BL may be coupled to the plurality of NAND strings.

The second type doping regions 1311 to 1314 extending along the first direction may be coupled to the other end of the NAND strings NS. The second type doping regions 1311 to 1314 extending along the first direction may serve as common source lines CSL.

In summary, the memory block BLKi may include the plurality of NAND strings NS extending along a direction (e.g., a second direction) perpendicular to the substrate 1111, and may operate as a NAND flash memory block (e.g., a charge trap type memory) in which the plurality of NAND strings NS are coupled to a single bit line BL.

With reference to FIGS. 10 to 12, it is described that the conductive materials 1211 to 1291, 1212 to 1292, and 1213 to 1293 extending along the first direction are provided on nine layers. However, the first conductive materials 1211 to 1291, 1212 to 1292, and 1213 to 1293 extending along the first direction are not limited to nine layers. For example, the conductive materials extending along the first direction may be provided upon eight, sixteen or more layers. That is, a NAND string may include eight, sixteen or more transistors.

With reference to FIGS. 10 to 12, it is described that three NAND strings NS are coupled to a single bit line BL. However, the embodiment will not be limited to three NAND strings NS coupled to a single bit line BL. In another embodiment, in the memory block BLKi, m NAND strings NS may be coupled to a single bit line BL, m being an integer. Here, the number of the conductive materials 1211 to 1291, 1212 to 1292, and 1213 to 1293 extending along the first direction and the number of common source lines 1311 to 1314 may also be adjusted so as to correspond to the number of NAND strings NS coupled to a single bit line BL.

With reference to FIGS. 10 to 12, it is described that three NAND strings NS are coupled to a single conductive material extending along the first direction. However, the embodiment will not be limited to three NAND strings NS coupled to a single conductive material. In another embodiment, n NAND strings NS may be coupled to a single conductive material, n being an integer. Here, the number of the conductive materials 1331 to 1333 extending along the third direction may also be adjusted so as to correspond to the number of NAND strings NS coupled to a single conductive material.

Figure 13:
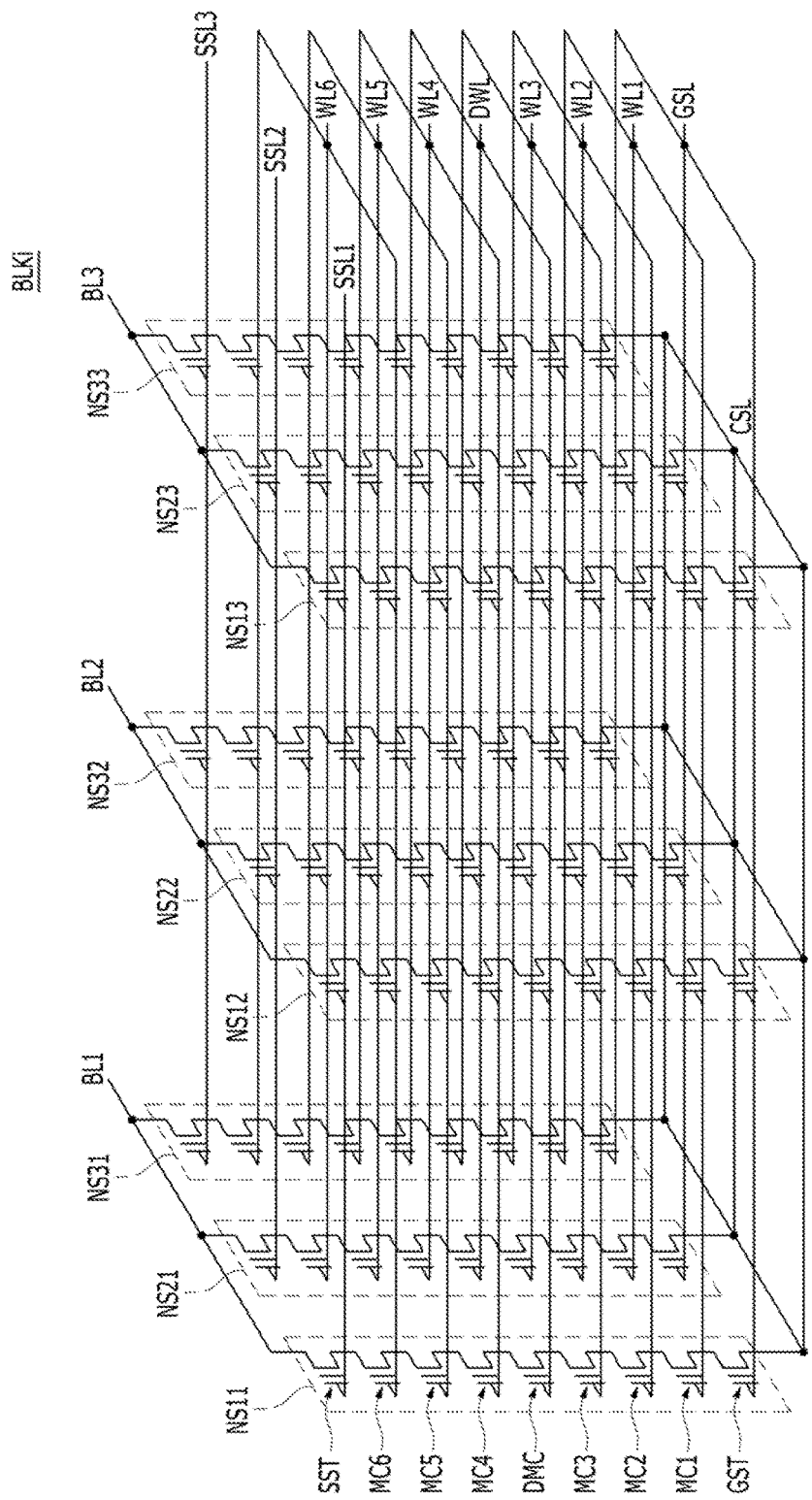

FIG. 13 is an equivalent circuit diagram illustrating the memory block BLKi described with reference to FIGS. 10 to 12.

Referring to FIGS. 10 to 13, NAND strings NS11 to NS31 may be provided between a first bit line BL1 and a common source line CSL. The first bit line BL1 may correspond to the conductive material 1331 extending along the third direction. NAND strings NS12 to NS32 may be provided between a second bit line BL2 and the common source line CSL. The second bit line BL2 may correspond to the conductive material 1332 extending along the third direction. NAND strings NS13 to NS33 may be provided between a third bit line BL3 and the common source line CSL. The third bit line BL3 may correspond to the conductive material 1333 extending along the third direction.

A string select transistor SST of each NAND string NS may be coupled to a corresponding bit line BL. A ground select transistor GST of each NAND string NS may be coupled to the common source line CSL. Memory cells MC may be provided between the string select transistor SST and the ground select transistor GST of each NAND string NS.

The NAND strings NS may be defined in units of rows and columns. The NAND strings NS commonly coupled to a single bit line may form a single column. For example, the NAND strings NS11 to NS31 coupled to the first bit line BL1 may correspond to a first column. The NAND strings NS12 to NS32 coupled to the second bit line BL2 may correspond to a second column. The NAND strings NS13 to NS33 coupled to the third bit line BL3 may correspond to a third column.

The NAND strings NS coupled to a single string select line SSL may form a single row. For example, the NAND strings NS11 to NS13 coupled to a first string select line SSL1 may form a first row. The NAND strings NS21 to NS23 coupled to a second string select line SSL2 may form a second row. The NAND strings NS31 to NS33 coupled to a third string select line SSL3 may form a third row.

A height may be defined for each NAND string NS. For example, the height of the ground select transistor GST may be defined as a value '1' in each NAND string NS. In each NAND string NS, the closer to the string selection transistor SST, the higher the height of the memory cell with reference to the substrate 1111, when measured from the substrate 1111. In each NAND string NS, the height of the memory cell MC6 adjacent to the string select transistor SST may be defined as a value '8', which is eight times greater than the ground select transistor GST.

The string select transistors SST of the NAND strings NS of the same row may share the same string select line SSL. The string select transistors SST of the NAND strings NS in different rows may be coupled with different string select lines SSL1, SSL2, and SSL3, respectively.

The memory cells MC having the same height in the NAND strings NS of the same row may share a word line WL. At a predetermined height, the word line WL may be shared by the memory cells MC of the NAND strings NS in different rows but in the same level or at the same height. At a predetermined height or at the same level, dummy memory cells DMC of the NAND strings NS of the same row may share a dummy word line DWL. At a predetermined height or level, the dummy memory cells DMC of the NAND strings NS in different rows may share the dummy word lines DWL.

For example, the word lines WL or the dummy word lines DWL located at the same level or height or layer may be commonly coupled on layers where the conductive materials 1211 to 1291, 1212 to 1292, and 1213 to 1293 extending in the first direction are provided. For example, the conductive materials 1211 to 1291, 1212 to 1292, and 1213 to 1293 provided at a given level or height or layer may be coupled to an upper layer via a contact. The conductive materials 1211 to 1291, 1212 to 1292, and 1213 to 1293 extending in the first direction may be coupled in common at the upper layer. The ground select transistors GST of the NAND strings NS of the same row may share the ground select line GSL. The ground select transistors GST of the NAND strings NS in different rows may share the ground select line GSL. That is, the NAND strings NS11 to NS13, NS21 to NS23, and NS31 to NS33 may be coupled in common to the ground select line GSL.

The common source line CSL may be commonly coupled to the NAND strings NS. For example, the first to fourth doping regions 1311 to 1314 may be coupled at an active region of the substrate 1111. For example, the first to fourth doping regions 1311 to 1314 may be coupled to an upper layer via a contact. The first to fourth doping regions 1311 to 1314 may be coupled in common at the upper layer.

As illustrated in FIG. 13, the word lines WL at the same height or level may be commonly coupled. Therefore, when a word line WL at a specific height is selected, all of the NAND strings NS coupled to the selected word line WL may be selected. The NAND strings NS in different rows may be coupled to different string select lines SSL. Accordingly, among the NAND strings NS coupled to the same word line WL, the NAND strings NS of the unselected row may be electrically isolated from the bit lines BL1 to BL3 according to selection of the string selection lines SSL1 to SSL3. That is, a row of the NAND strings NS may be selected by selecting one of the string select lines SSL1 to SSL3. The NAND strings NS of the selected row may be selected in units of columns according to selection of the bit lines BL1 to BL3.

In each NAND string NS, a dummy memory cell DMC may be provided. FIG. 13 shows the dummy memory cell DMC provided between the third memory cell MC3 and the fourth memory cell MC4 in each NAND string NS. That is, the first to third memory cells MC1 to MC3 may be provided between the dummy memory cell DMC and the ground select transistor GST. The fourth to sixth memory cells MC4 to MC6 may be provided between the dummy memory cell DMC and the string select transistor SST. In the embodiment, it is exemplarily assumed that the memory cells MC in each NAND string NS are divided into memory cell groups by the dummy memory cell DMC. A memory cell group (e.g., MC1 to MC3) that is adjacent to the ground select transistor GST among the memory cell groups may be referred to as a lower memory cell group. A memory cell group (e.g., MC4 to MC6) adjacent to the string select transistor SST among the memory cell groups may be referred to as an upper memory cell group.

An operating method of a non-volatile memory device which includes one or more cell strings each arranged in a direction perpendicular to a substrate coupled with a memory controller and including memory cells, a string select transistor, and a ground select transistor will be described with reference to FIGS. 9 to 13. With the operating method, the non-volatile memory device: may be provided with a first read command to perform first and second hard decision read operations according to a first hard decision read voltage and a second hard decision read voltage, which is different from the first hard decision read voltage; may acquire hard decision data; may select one of the first and second hard decision voltages based on an error bit state of the hard decision data; may acquire soft decision read data according to a soft decision read voltage, which is different from the first and second hard decision read voltages; and may provide the soft decision read data to a memory controller.

Figure 14:
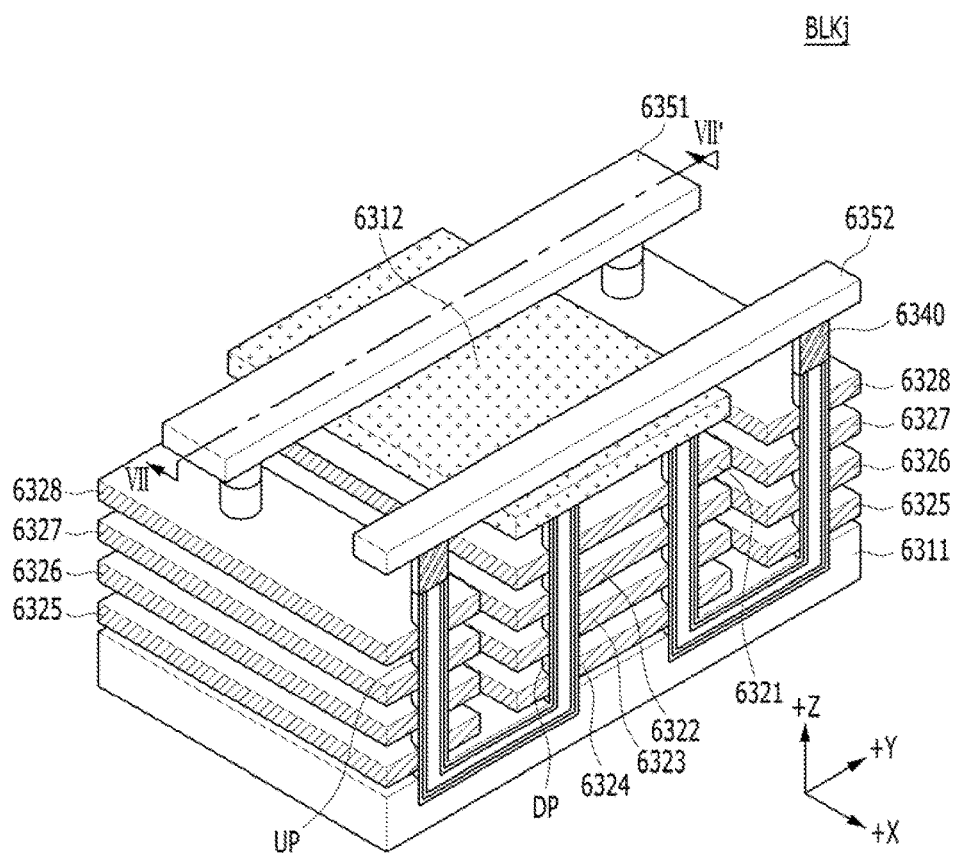
FIGS. 14, 15 and 16 are diagrams schematically illustrating a 3D non-volatile memory device in accordance with an embodiment of the present invention.
Figure 15:
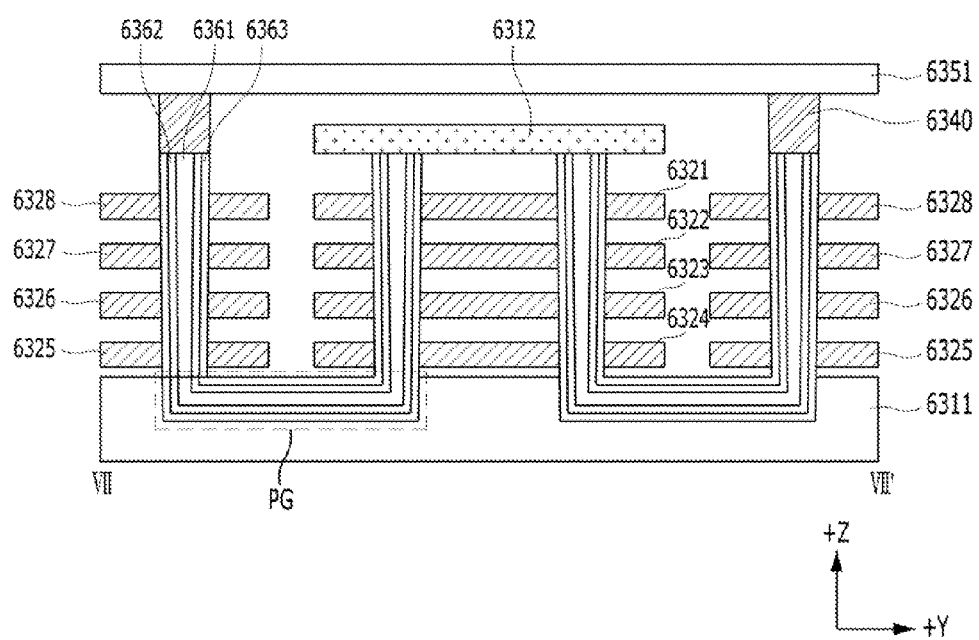
Figure 16:
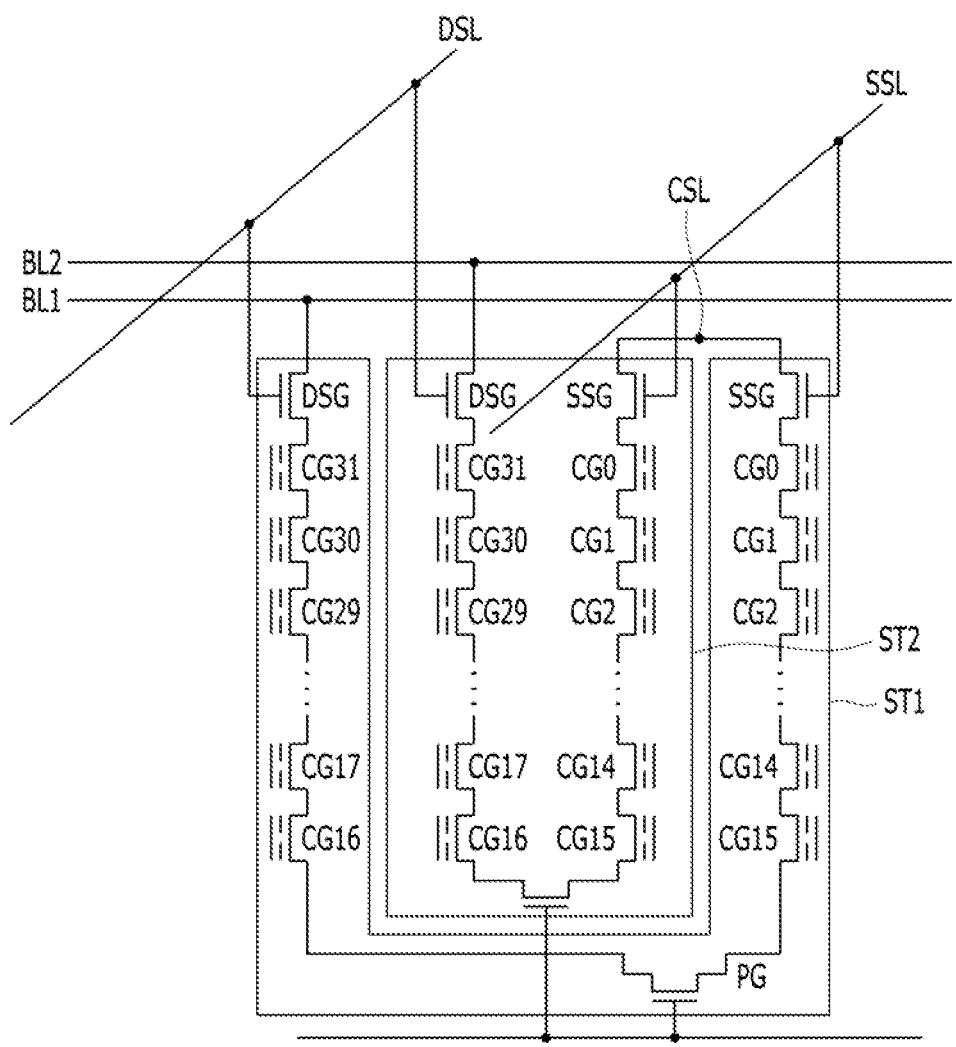

FIGS. 14 to 16 are diagrams schematically illustrating a 3D non-volatile memory device in accordance with an embodiment of the present invention. FIGS. 14 to 16 illustrate the semiconductor memory device (e.g., a flash memory device) implemented in 3D in accordance with an embodiment of the present invention.

FIG. 14 is a perspective view illustrating one memory block BLKj of the memory blocks 211 shown in FIG. 5. FIG. 15 is a sectional view illustrating the memory block BLKj taken along the line VII-VII' shown in FIG. 14.

Referring to FIGS. 14 and 15, the memory block BLKj may include a structure extending along first to third directions.

A substrate 6311 may be provided. For example, the substrate 6311 may include a silicon material doped by a first type impurity. For example, the substrate 6311 may include a silicon material doped by a p-type impurity or a p-type well (e.g., a pocket p-well). The substrate 6311 may further include an n-type well surrounding the p-type well. In the embodiment, it is exemplarily assumed that the substrate

6311 is p-type silicon. However, the substrate 6311 will not be limited to the p-type silicon.

First to a fourth conductive material layers 6321 to 6324 extending along the X-direction and the Y-direction may be disposed over the substrate 6311. The first to fourth conductive material layers 6321 to 6324 may be spaced from one another in the Z-direction.

Fifth to eighth conductive material layers 6325 to 6328 extending along the X-direction and the Y-direction may be disposed over the substrate 6311. The fifth to eighth conductive material layers 6325 to 6328 may be spaced from one another in the Z-direction. The fifth to eighth conductive material layers 6325 to 6328 may be spaced from the first to fourth conductive material layers 6321 to 6324 in the Y-direction.

A plurality of lower pillars DP may be formed to penetrate the first to fourth conductive material layers 6321 to 6324. Each of the lower pillars DP may be extended in the Z-direction. A plurality of upper pillars UP may be formed to penetrate the fifth to eighth conductive material layers 6325 to 6328. Each of the upper pillars UP may be extended in the Z-direction.

Each of the lower pillars DP and the upper pillars UP may include an internal material layer 6361, a middle layer 6362 and a surface layer 6363. The middle layer 6362 may serve as a channel of the cell transistor. The surface layer 6363 may include a blocking insulating layer, an electric charge storage layer, and a tunnel insulating layer.

The lower pillars DP and the upper pillars UP may be coupled through a pipe gate PG. The pipe gate PG may be formed in the substrate 6311. For example, the pipe gate PG may include substantially the same material as the lower pillars DP and the upper pillars UP.

A doping material layer 6312 doped with a second type impurity may be disposed over the lower pillars DP. The doping material layer 6312 may extend in the X direction and the Y direction. For example, the doping material layer 6312 doped with the second type impurity may include an n-type silicon material. The doping material layer 6312 doped with the second type impurity may serve as the common source line CSL.

Drains 6340 may be formed over each of the upper pillars UP. For example, the drain 6340 may include an n-type silicon material. First and second upper conductive material layers 6351 and 6352 may be formed over the drains 6340. The first and second upper conductive material layers 6351 and 6352 may be extended in the Y-direction.

The first and second upper conductive material layers 6351 and 6352 may be spaced apart from each other in the X-direction. For example, the first and second upper conductive material layers 6351 and 6352 may be made of metal. For example, the first and second upper conductive material layers 6351 and 6352 may be coupled to the drains 6340 through contact plugs. The first and second upper conductive material layers 6351 and 6352 may serve as first and second bit lines BL1 and BL2, respectively.

The first conductive material layer 6321 may serve as the source select line SSL, and the second conductive material layer 6322 may serve as the first dummy word line DWL1, and the third and fourth conductive material layers 6323 and 6324 may serve as the first and second main word lines MWL1 and MWL2, respectively. The fifth and sixth conductive material layers 6325 and 6326 may serve respectively as the third and fourth main word lines MWL3 and MWL4, the seventh conductive material layer 6327 may serve as the second dummy word line DWL2, and the eighth conductive material layer 6328 may serve as the drain select line DSL.

Each of the lower pillars DP and the first to fourth conductive material layers 6321 to 6324 adjacent to the lower pillar DP may form a lower string. Each of the upper pillars UP and the fifth to eighth conductive material layers 6325 to 6328 adjacent to the upper pillar UP may form an upper string. The lower string and the upper string may be coupled through the pipe gate PG. One end of the lower string may be coupled to the second-type doping material layer 6312 serving as the common source line CSL. One end of the upper string may be coupled to a corresponding bit line through the drain 6340. The lower string and the upper string are coupled through the pipe gate PG. A single lower string and a single upper string may form a single cell string coupled between the second-type doping material layer 6312 serving as the common source line CSL and a corresponding one of the upper conductive material layers 6351 and 6352 serving as the bit line BL.

That is, the lower string may include the source select transistor SST, the first dummy memory cell DMC1, and the first and second main memory cells MMC1 and MMC2. The upper string may include the third and fourth main memory cells MMC3 and MMC4, the second dummy memory cell DMC2 and the drain select transistor DST.

Referring to FIGS. 14 and 15, the upper string and the lower string may form the NAND string NS having a plurality of transistor structures TS. The transistor structure TS may be substantially the same as the transistors described with reference to FIG. 12.

FIG. 16 is an equivalent circuit diagram illustrating the memory block BLKj described with reference to FIGS. 14 and 15. FIG. 16 exemplarily shows first and second strings among the strings included in the memory block BLKj.

Referring to FIG. 16, the memory block BLKj may include a plurality of cell strings, each of which comprises a single upper string and a single lower string coupled to each other through the pipe gate PG, as described with reference to FIGS. 14 and 15.

In the memory block BLKj, memory cells CG0 to CG31 stacked along a first channel layer CH1 (not shown), one or more source selection gates SSG, and one or more drain selection gates DSG may form a first string ST1. Memory cells CG0 to CG31 stacked along a second channel layer CH2 (not shown), one or more source selection gates SSG, and one or more drain selection gates DSG may form a second string ST2.

The first and second strings ST1 and ST2 may be coupled to a single drain selection line DSL and a single source selection line SSL. The first string ST1 may be coupled to a first bit line BL1, and the second string ST2 may be coupled to a second bit line BL2.

FIG. 16 shows the first and second strings ST1 and ST2 coupled to a single drain selection line DSL and a single source selection line SSL. In another embodiment, the first and second strings ST1 and ST2 may be coupled to a single source selection line SSL and a single bit line BL. In such case, the first string ST1 may be coupled to the first drain selection line DSL1, and the second string ST2 may be coupled to the second drain selection line DSL2. In another embodiment, the first and second strings ST1 and ST2 may be coupled to a single drain selection line DSL and a single bit line BL. In such case, the first string ST1 may be coupled to the first source selection line SSL1, and the second string ST2 may be coupled to the second source selection line SSL2.

Figure 17:
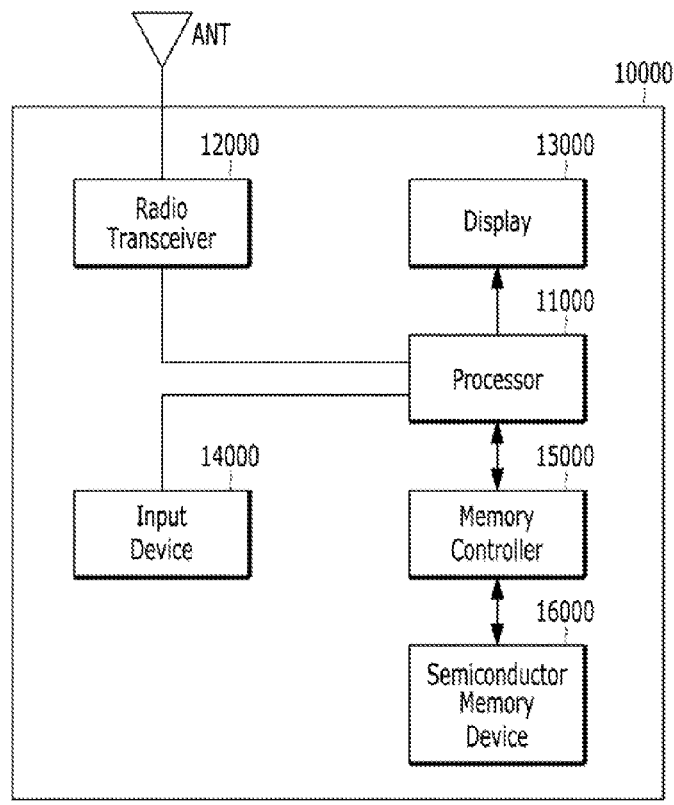
FIG. 17 is a block diagram schematically illustrating an electronic device including a semiconductor memory system in accordance with an embodiment of the present invention.

FIG. 17 is a block diagram schematically illustrating an electronic device 10000 including a memory controller 15000 and a semiconductor memory device 16000 in accordance with an embodiment of the present invention.

Referring to FIG. 17, the electronic device 10000 such as a cellular phone, a smart phone, or a tablet PC may include the semiconductor memory device 16000 implemented by a flash memory device and the memory controller 15000 to control the semiconductor memory device 16000.

The semiconductor memory device 16000 may correspond to the semiconductor memory device 200 described above with reference to FIGS. 3 to 13. The semiconductor memory device 16000 may store random data.

The memory controller 15000 may correspond to the memory controller described with reference to FIGS. 3 to 13. The memory controller 15000 may be controlled by a processor 11000 which controls overall operations of the electronic device 10000.

Data stored in the semiconductor memory device 16000 may be displayed through a display 13000 under the control of the memory controller 15000. The memory controller 15000 operates under the control of the processor 11000.

A radio transceiver 12000 may receive and output a radio signal through an antenna ANT. For example, the radio transceiver 12000 may convert the received radio signal from the antenna ANT into a signal to be processed by the processor 11000. Thus, the processor 11000 may process the converted signal from the radio transceiver 12000, and may store the processed signal at the semiconductor memory device 16000. Otherwise, the processor 11000 may display the processed signal through the display 13000.

The radio transceiver 12000 may convert a signal from the processor 11000 into a radio signal, and may output the converted radio signal to an external device through the antenna ANT.

An input device 14000 may receive a control signal for controlling operations of the processor 11000 or data to be processed by the processor 11000, and may be implemented by a pointing device such as a touch pad or a computer mouse, a key pad, or a keyboard.

The processor 11000 may control the display 13000 such that the data from the semiconductor memory device 16000, the radio signal from the radio transceiver 12000 or the data from the input device 14000 is displayed through the display 13000.

Figure 18:
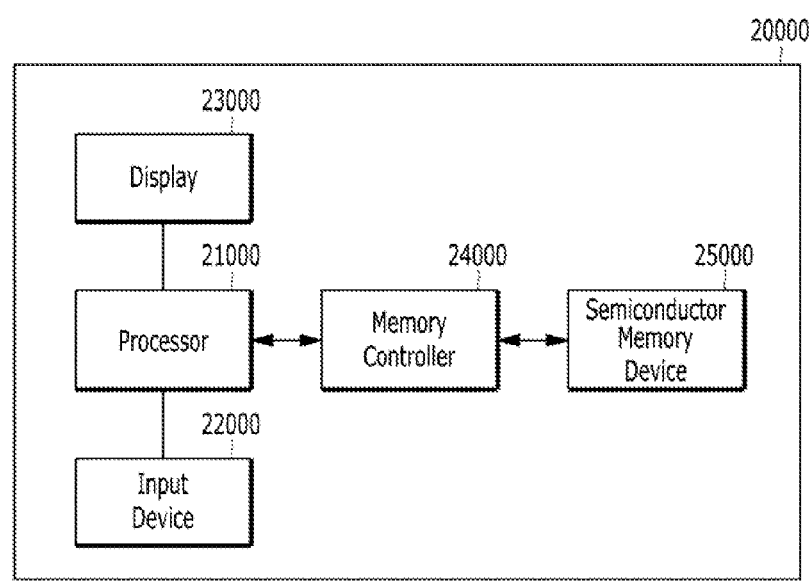
FIG. 18 is a block diagram schematically illustrating an electronic device including a semiconductor memory system in accordance with an embodiment of the present invention.

FIG. 18 is a block diagram schematically illustrating an electronic device 20000 including a memory controller 24000 and a semiconductor memory device 25000 in accordance with an embodiment of the present invention.

The memory controller 24000 and the semiconductor memory device 25000 may correspond to the memory controller 100 and the semiconductor memory device 200 described with reference to FIGS. 3 to 13, respectively.

Referring to FIG. 18, the electronic device 20000 may be implemented by a data processing device such as a personal computer (PC), a tablet computer, a net-book, an e-reader, a personal digital assistant (PDA), a portable multimedia player (PMP), an MP3 player, or an MP4 player, and may include the semiconductor memory device 25000 (e.g., the flash memory device) and the memory controller 24000 to control operations of the semiconductor memory device 25000.

The electronic device 20000 may include a processor 21000 to control overall operations of the electronic device 20000. The memory controller 24000 may be controlled by the processor 21000.

The processor 21000 may display data stored in the semiconductor memory device 25000 through a display 23000 according to an input signal from an input device 22000. For example, the input device 22000 may be implemented by a pointing device such as a touch pad or a computer mouse, a key pad, or a keyboard.

Figure 19:
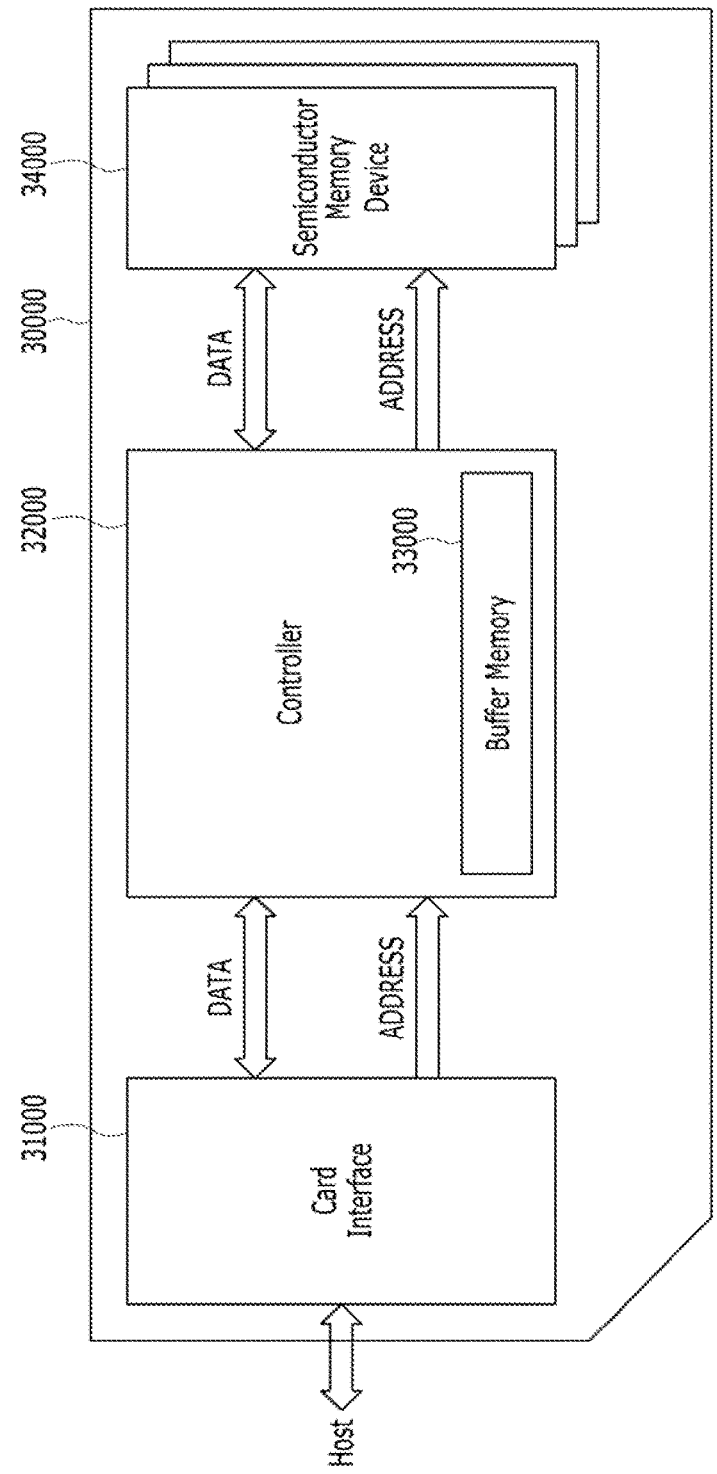
FIG. 19 is a block diagram schematically illustrating an electronic device including a semiconductor memory system in accordance with an embodiment of the present invention.

FIG. 19 is a block diagram schematically illustrating an electronic device 30000 including a controller 32000 and a semiconductor memory device 34000 in accordance with an embodiment of the present invention.

The controller 32000 and the semiconductor memory device 34000 may correspond to the memory controller 100 and the semiconductor memory device 200 described with reference to FIGS. 3 to 13, respectively.

Referring to FIG. 19, the electronic device 30000 may include a card interface 31000, the controller 32000, and the semiconductor memory device 34000 (e.g., a flash memory device).

The electronic device 30000 may exchange data with a host through the card interface 31000. The card interface 31000 may be a secure digital (SD) card interface or a multi-media card (MMC) interface, which will not limit the scope of the present invention. The card interface 31000 may interface the host and the controller 32000 according to a communication protocol of the host capable of communicating with the electronic device 30000.

The controller 32000 may control an overall operation of the electronic device 30000, and may control data exchange between the card interface 31000 and the semiconductor memory device 34000. A buffer memory 33000 of the controller 32000 may buffer data transferred between the card interface 31000 and the semiconductor memory device 34000.

The controller 32000 may be coupled with the card interface 31000 and the semiconductor memory device 34000 through a data bus DATA and an address bus ADDRESS. In accordance with an embodiment, the controller 32000 may receive an address of data, which is to be read or written, from the card interface 31000, through the address bus ADDRESS, and may send it to the semiconductor memory device 34000. Further, the controller 32000 may receive or transfer data to be read or written through the data bus DATA connected with the card interface 31000 or the semiconductor memory device 34000.

When the electronic device 30000 is connected with the host such as a PC, a tablet PC, a digital camera, a digital audio player, a mobile phone, console video game hardware or a digital set-top box, the host may exchange data with the semiconductor memory device 34000 through the card interface 31000 and the controller 32000.

Figure 20:
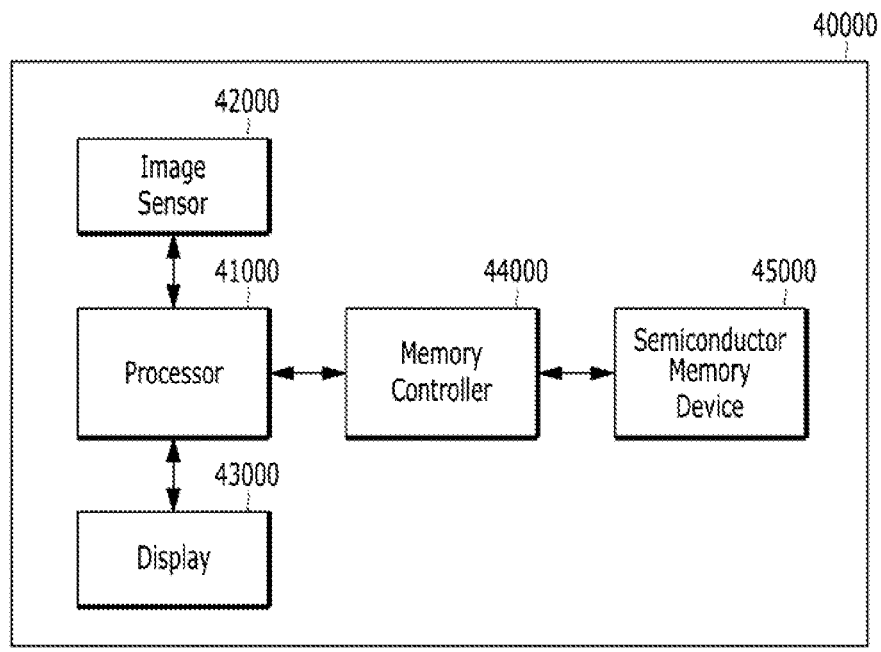
FIG. 20 is a block diagram schematically illustrating an electronic device including a semiconductor memory system in accordance with an embodiment of the present invention.

FIG. 20 is a block diagram schematically illustrating an electronic device 40000 including a memory controller 44000 and a semiconductor memory device 45000 in accordance with an embodiment of the present invention.

The memory controller 44000 and the semiconductor memory device 45000 may correspond to the memory controller 100 and the semiconductor memory device 200 described with reference to FIGS. 3 to 13, respectively.

Referring to FIG. 20, the electronic device 40000 may include the semiconductor memory device 45000 (e.g., the flash memory device), the memory controller 44000 to control a data processing operation of the semiconductor memory device 45000, and a processor 41000 to control overall operations of the electronic device 40000.

Further, an image sensor 42000 of the electronic device 40000 may convert an optical signal into a digital signal, and the converted digital signal may be stored in the semiconductor memory device 45000 under the control of the processor 41000. Otherwise, the converted digital signal may be displayed through a display 43000 under the control of the processor 41000.

Figure 21:
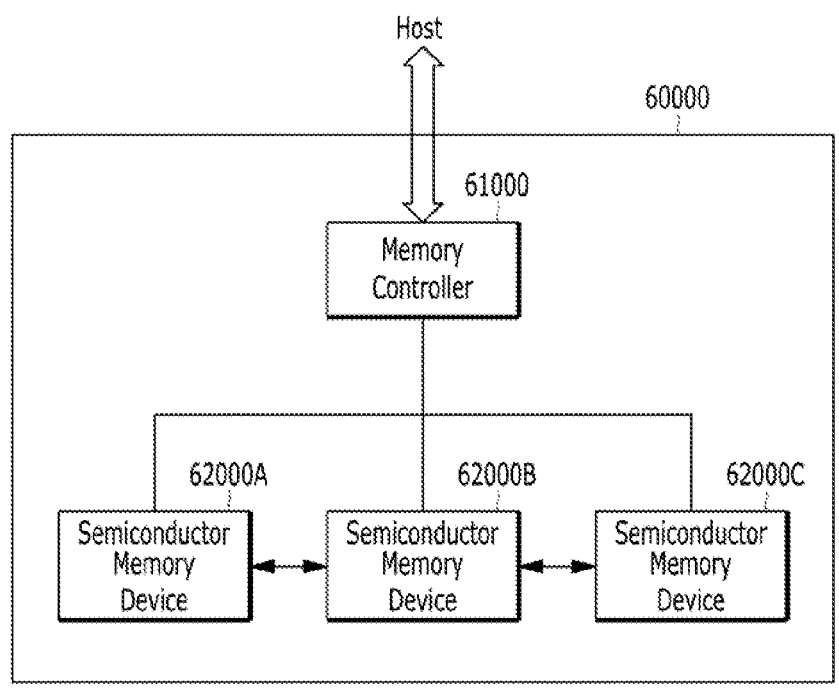
FIG. 21 is a block diagram schematically illustrating an electronic device including a semiconductor memory system in accordance with an embodiment of the present invention.

FIG. 21 is a block diagram schematically illustrating an electronic device 60000 including a memory controller 61000 and semiconductor memory devices 62000A, 62000B, and 62000C in accordance with an embodiment of the present invention.

The memory controller 61000 and each of the semiconductor memory devices 62000A, 62000B, and 62000C may correspond to the memory controller 100 and the semiconductor memory device 200 described with reference to FIGS. 3 to 13, respectively.

Referring to FIG. 21, the electronic device 60000 may be implemented by a data storage device such as a solid state drive (SSD).

The electronic device 60000 may include the plurality of semiconductor memory devices 62000A, 62000B, and 62000C and the memory controller 61000 to control a data processing operation of each of the semiconductor memory devices 62000A, 62000B, and 62000C.

The electronic device 60000 may be implemented by a memory system or a memory module.

For example, the memory controller 61000 may be implemented outside or inside the electronic device 60000.

Figure 22:
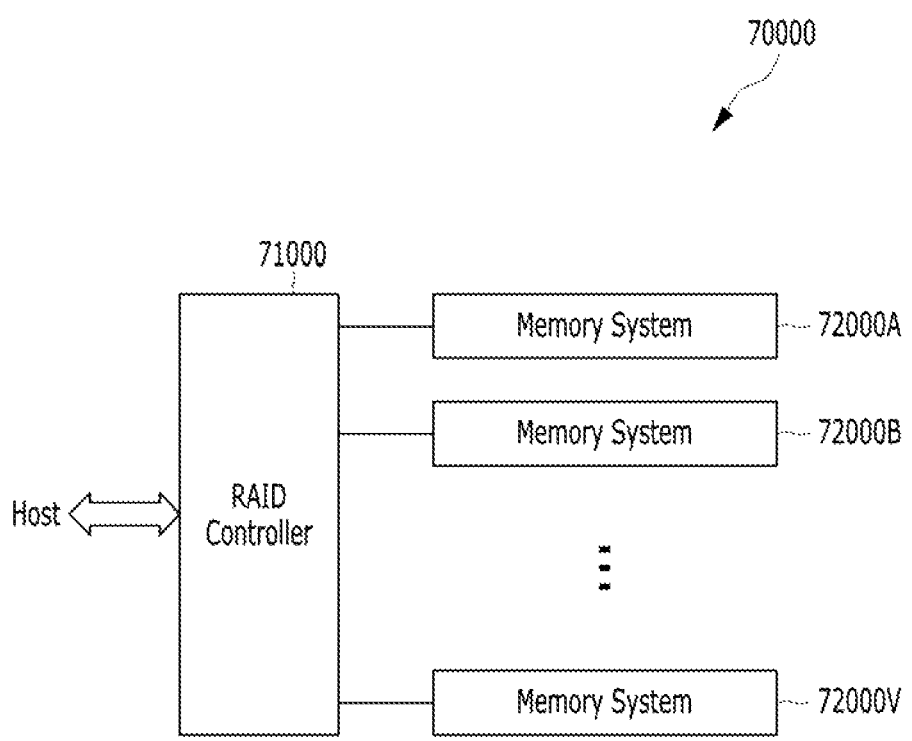
FIG. 22 is a block diagram of a data processing system including an electronic device shown in FIG. 21.

FIG. 22 is a block diagram of a data processing system including the electronic device 6000 described with reference to FIG. 21.

Referring to FIGS. 21 and 22, a data storage device 70000 may be implemented by a redundant array of independent disks (RAID) system. The data storage device 70000 may include a RAID controller 71000 and a plurality of memory systems 72000A to 72000N, where N is a natural number.

Each of the memory systems 72000A to 72000N may correspond to the electronic device 60000 described with reference to FIG. 21. The memory systems 72000A to 72000N may form a RAID array. The data storage device 70000 may be implemented by an SSD.

During a program operation, the RAID controller 71000 may output program data, which is output from a host, to one of the memory systems 72000A to 72000N according to one selected from a plurality of RAID levels based on RAID level information output from the host.

During a read operation, the RAID controller 71000 may transfer data, which is read from one of the memory systems 72000A to 72000N, to the host according to one selected from the plurality of RAID levels based on the RAID level information output from the host.

While the present invention has been described with respect to the specific embodiments, it will be apparent to those skilled in the art that various changes and modifications may be made without departing from the spirit and scope of the invention as defined in the following claims.

What is claimed is:

1. An operation method of a controller comprising:
generating error reliability of data based on reliability information of one or more error-corrected bits of the data, wherein the data is read out from a semiconductor memory device and a hard decision ECC decoding to the data through a Bose-Chaudhuri-Hocquenghem (BCH) code is determined as successful; and
determining miscorrection of the data based on the error reliability,
wherein the determining of the miscorrection determines the data as miscorrected when the error reliability of the data is greater than a predetermined reliability threshold.

2. The operation method of claim 1, wherein the error reliability is represented by a following equation:

$$RELER = abs(SV1) + abs(SV2) + \ldots + abs(SVN),\qquad \text{[Equation]}$$

wherein "RELER" represents the error reliability, "SVn" ($1 \leq n \leq N$) represents,
the reliability information of the error-corrected bits of the data, "n" represents a natural number, and "N" represents the number of the errors.

3. The operation method of claim 2, wherein the reliability information is a log likelihood ratio (LLR).

4. The operation method of claim 1, wherein the predetermined reliability threshold is represented by a following equation:

$$RELTH1 = N*P,\qquad \text{[Equation]}$$

wherein "RELTH1" is the predetermined reliability threshold, "N" is a number of the error-corrected bits, and "P" is a parameter.

5. The operation method of claim 4, wherein the P is about 0.5.

6. An operation method of a controller comprising:
a first step of generating, when a hard decision ECC decoding to data fails, the data being read out from a semiconductor memory device according to a first hard decision read voltage, error reliability of the data being based on reliability information of one or more error-corrected bits of the data, wherein the reliability information is obtained according to first soft decision read voltages determined on the basis of the first hard read voltage;
a second step of determining whether to perform a soft decision ECC decoding to the data according to the first soft decision read voltages,
by comparing the error reliability with a predetermined reliability threshold; and
a third step of performing the hard decision ECC decoding to the data according to a second hard decision read voltage when the error reliability is less than the predetermined reliability threshold.

7. The operation method of claim 6, wherein the error reliability is represented by a following equation:

$$RELER = abs(SV1) + abs(SV2) + \ldots + abs(SVN),\qquad \text{[Equation]}$$

wherein "RELER" represents the error reliability, "SVn" ($1 \leq n \leq N$) represents the reliability information of the error-corrected bits of the data, "n" represents a natural number, and "N" represents the number of the errors.

8. The operation method of claim 7, wherein the reliability information is a log likelihood ratio (LLR).

9. The operation method of claim 6, wherein the hard decision decoding is performed through a turbo product code (TPC).

10. The operation method of claim 6, wherein the soft decision decoding is performed through a turbo product code (TPC).

11. A controller comprising:
a hard decision ECC decoding means suitable for reading out data from a semiconductor memory device, and performing a hard decision ECC decoding to the data through a Bose-Chaudhuri-Hocquenghem (BCH) code; and a miscorrection determination means suitable for determining miscorrection of the data, to which the hard decision ECC decoding is determined as successful, by using error reliability of data, which is generated on the basis of reliability information of one or more error-corrected bits of the data, wherein the miscorrection determination means determines the data as miscorrected when the error reliability of the data is greater than a predetermined reliability threshold.

12. The controller of claim 11, wherein the error reliability is represented by a following equation:

$$RELER = abs(SV1) + abs(SV2) + \ldots + abs(SVN), \quad \text{[Equation]}$$

wherein "RELER" represents the error reliability, "SVn" ($1 \leq n \leq N$) represents the reliability information of the error-corrected bits of the data, "n" represents a natural number, and "N" represents the number of the errors.

13. The controller of claim 12, wherein the reliability information is a log likelihood ratio (LLR).

14. The controller of claim 11, wherein the predetermined reliability threshold is represented by a following equation:

$$RELTH1 = N*P, \quad \text{[Equation]}$$

wherein "RELTH1" is the predetermined reliability threshold, "N" is a number of the error-corrected bits, and "P" is a parameter.

15. The controller of claim 14, wherein the P is about 0.5.

16. A controller comprising:
a hard decision unit suitable for performing a hard decision ECC decoding to data read out from a semiconductor memory device according to a hard decision read voltage; and
a soft decision unit suitable for performing a soft decision ECC decoding to the data according soft decision read voltages when the hard decision ECC decoding to data fails, wherein, the hard decision unit generates, when the hard decision ECC decoding to data fails according to a first hard decision read voltage, error reliability of the data based on reliability information of one or more error-corrected bits of the data, wherein the reliability information is obtained according to first soft decision read voltages determined on the basis of the first hard read voltage, wherein, the hard decision unit determines whether to perform the soft decision ECC decoding to the data according to the first soft decision read voltages, by comparing the error reliability with a predetermined reliability threshold, and wherein the hard decision unit further performs the hard decision ECC decoding to the data according to a second hard decision read voltage when the error reliability is less than the predetermined reliability threshold.

17. The controller of claim 16, wherein the error reliability is represented by a following equation:

$$RELER = abs(SV1) + abs(SV2) + \ldots + abs(SVN), \quad \text{[Equation]}$$

wherein "RELER" represents the error reliability, and "SVn" ($1 \leq n \leq N$) represents the reliability information of the error-corrected bits of the data, "n" represents a natural number, and "N" represents the number of the errors.

18. The controller of claim 17, wherein the reliability information is a log likelihood ratio (LLR).

19. The controller of claim 16, wherein the hard decision decoding is performed through a turbo product code (TPC).

20. The controller of claim 16, wherein the soft decision decoding is performed through a turbo product code (TPC).

* * * * *